(12) United States Patent  
Han et al.

(10) Patent No.: US 12,490,614 B2
(45) Date of Patent: Dec. 2, 2025

(54) DISPLAY PANEL, EVAPORATION MASK, DISPLAY DEVICE AND PREPARATION METHOD

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Bing Han, Wuhan (CN); Yu Xin, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 1014 days.

(21) Appl. No.: 17/538,892

(22) Filed: Nov. 30, 2021

(65) Prior Publication Data

US 2023/0017933 A1     Jan. 19, 2023

(30) Foreign Application Priority Data

Jun. 30, 2021   (CN) .......................... 202110736750.5

(51) Int. Cl.
*H10K 59/35* (2023.01)
*C23C 14/04* (2006.01)
(Continued)

(52) U.S. Cl.
CPC ............. *H10K 59/35* (2023.02); *C23C 14/04* (2013.01); *C23C 14/24* (2013.01); *H10K 71/166* (2023.02)

(58) Field of Classification Search
CPC .... H10K 59/35; H10K 59/353; H10K 71/166; C23C 14/04; C23C 14/042; C23C 14/12; C23C 14/24; C23C 14/54
(Continued)

(56) References Cited

U.S. PATENT DOCUMENTS

2002/0064966 A1* 5/2002 Seki ..................... H10K 71/135
                                                                                438/82
2003/0142043 A1* 7/2003 Matsueda ............. G02F 1/1341
                                                                                345/30
(Continued)

FOREIGN PATENT DOCUMENTS

CN          105280842 A      1/2016
CN          106637074 A      5/2017
(Continued)

*Primary Examiner* — Norman D Richards
(74) *Attorney, Agent, or Firm* — ALSTON & BIRD LLP

(57) ABSTRACT

Provided are a display panel, an evaporation mask, a display device and a preparation method. A display region of the display panel includes multiple first sub-pixels and multiple second sub-pixels, and the multiple first sub-pixels and the multiple second sub-pixels have a same shape and a same size and are different in color; a pattern composed of the multiple first sub-pixels is at least partially consistent with a pattern composed of the multiple second sub-pixels, and mutually consistent patterns are staggered in a first direction, and $\vec{d_1}$ denotes a staggered vector in the first direction; a non-display region includes a first offset mark A1 and a second offset mark A2, $\vec{L_1}$ denotes a vector connecting a center of the first offset mark A1 and a center of the second offset mark A2, and the vector $\vec{L_1}$ satisfies: $\vec{L_1} = \vec{d_1} + \vec{t_1}$; where $\vec{t_1}$ denotes a first preset deviation.

23 Claims, 19 Drawing Sheets

(51) Int. Cl.
*C23C 14/24* (2006.01)
*H10K 71/16* (2023.01)

(58) Field of Classification Search
USPC .......................................................... 257/40
See application file for complete search history.

(56) References Cited

U.S. PATENT DOCUMENTS

2005/0236620 A1* 10/2005 Yamada ............... H10K 71/191
257/59
2016/0343944 A1* 11/2016 Lee ........................ H10K 59/88
2022/0199905 A1* 6/2022 Lee ........................ H10K 71/00

FOREIGN PATENT DOCUMENTS

CN  108977762 B  12/2019
CN  112289961 A   1/2021

\* cited by examiner

DISPLAY PANEL, EVAPORATION MASK, DISPLAY DEVICE AND PREPARATION METHOD

CROSS-REFERENCE TO RELATED APPLICATION(S)

This application claims the priority to a Chinese patent application No. CN 202110736750.5 filed at the CNIPA on Jun. 30, 2021, disclosure of which is incorporated herein by reference in its entirety.

TECHNICAL FIELD

Embodiments of the present disclosure relate to the field of display technologies, and in particular, to a display panel, an evaporation mask, a display device and a preparation method.

BACKGROUND

At present, an organic light-emitting diode (OLED) adopts a vacuum evaporation technology to prepare organic film layers such as a light-emitting layer and a compensation layer. In a preparation process of the device, an organic material is deposited on a substrate disposed above an evaporation source through the high-temperature evaporation, and an evaporation mask needs to be used in order to evaporate the organic material to a specific position according to the design. A pre-designed pixel opening pattern is reserved on the evaporation mask, and through this pixel opening, the organic material when deposited onto the substrate will form a pixel with a same shape. Moreover, in order to determine whether offset exists during evaporation, an offset mark opening is designed at a periphery of a sub-pixel opening pattern on the evaporation mask, and the organic material is deposited on the substrate through the offset mark opening to form an offset mark which is used for measuring and detecting the offset.

However, when an existing panel is used for preparing sub-pixels with different colors, multiple evaporation masks are adopted for preparation, the offset mark is formed while the sub-pixels are formed, and offset marks formed by using different evaporation masks are used for correspondingly measuring an offset condition of the evaporation masks, so that an offset condition of corresponding sub-pixels is represented. The process of preparing the display panel by using multiple evaporation masks is relatively complex; when a large number of evaporation masks are adopted for preparation, since the evaporation masks belong to precise metal masks, the cost of the evaporation masks is relatively high, and thus the project cost is increased.

SUMMARY

The present disclosure provides a display panel, an evaporation mask, a display device and a preparation method, which achieves the accurate offset measurement of the display panel and meanwhile reduces the process cost of the offset measurement.

In a first aspect, an embodiment of the present disclosure provides a display panel. The display panel includes a display region and a non-display region located at a periphery of the display region; where the display region includes multiple first sub-pixels and multiple second sub-pixels, and the multiple first sub-pixels and the multiple second sub-pixels have a same shape and a same size and are different in color; a pattern composed of the multiple first sub-pixels is at least partially consistent with a pattern composed of the multiple second sub-pixels, and at least part patterns of mutually consistent patterns are staggered in a first direction, and $\vec{d_1}$ denotes a staggered vector in the first direction; and the non-display region includes a first offset mark A1 and a second offset mark A2, the first offset mark A1 and the second offset mark A2 are disposed in the first direction, $\vec{L_1}$ denotes a vector connecting a center of the first offset mark A1 and a center of the second offset mark A2, and the vector $\vec{L_1}$ satisfies: $\vec{L_1} = \vec{d_1} + \vec{t_1}$; where $\vec{t_1}$ denotes a first preset deviation, and $|\vec{t_1}| \leq 10$ μm.

In a second aspect, an embodiment of the present disclosure further provides an evaporation mask. The evaporation mask is used for forming the display panel described in the first aspect through the evaporation mask. The evaporation mask includes a first evaporation region and a second evaporation region. The first evaporation region includes multiple sub-pixel openings, and the multiple sub-pixel openings are used for preparing and forming the multiple first sub-pixels and the multiple second sub-pixels in the display panel in different evaporation processes, respectively. The second evaporation region is located at a periphery of the first evaporation region, the second evaporation region includes an offset mark opening, and the offset mark opening is used for respectively preparing and forming the first offset mark A1 and the second offset mark A2 in the display panel in different evaporation processes.

In a third aspect, an embodiment of the present disclosure further provides a preparation method of a display panel. The display panel described in the first aspect is prepared by adopting the evaporation mask described in the second aspect, and the preparation method of the display panel includes: a base substrate is provided; a first compensation layer and/or a first light-emitting layer is deposited on the base substrate according to the multiple sub-pixel openings by using the evaporation mask, and meanwhile a first offset mark A1 is formed; and the evaporation mask is moved in the first direction according to a vector $\vec{L_1}$, a second compensation layer and/or a second light-emitting layer is deposited on the base substrate according to the multiple sub-pixel openings, and meanwhile a second offset mark A2 is formed, where the vector $\vec{L_1}$ satisfies: $\vec{L_1} = \vec{d_1} + \vec{t_1}$, where $\vec{t_1}$ is a first preset deviation, and $|\vec{t_1}| \leq 10$ μm.

In a fourth aspect, an embodiment of the present disclosure further provides a display device, including the display panel as described in the first aspect.

In the display panel, the evaporation mask, the display device and the preparation method provided in the embodiments of the present disclosure, the evaporation mask is provided with the first evaporation region and the second evaporation region disposed at the periphery of the first evaporation region, the first evaporation region includes the multiple sub-pixel openings, and the multiple sub-pixel openings are used for respectively preparing the first sub-pixels and the second sub-pixels in the display panel in different evaporation processes; the second evaporation region includes an offset mark opening, one offset mark opening is used for preparing two offset marks in the display panel in two evaporation processes, respectively, and offset conditions of film layers formed in different evaporation processes may be monitored respectively by detecting offsets of these two offset marks. According to this embodiment, problems of more evaporation masks and higher cost in the preparation process of an existing display panel are solved, different offset marks may be formed by shifting the evaporation mask, the accurate and effective measurement of an evaporation offset is achieved, precise metal masks are saved, and thus the cost of the evaporation offset measurement is greatly reduced.

DETAILED DESCRIPTION

Figure 1:
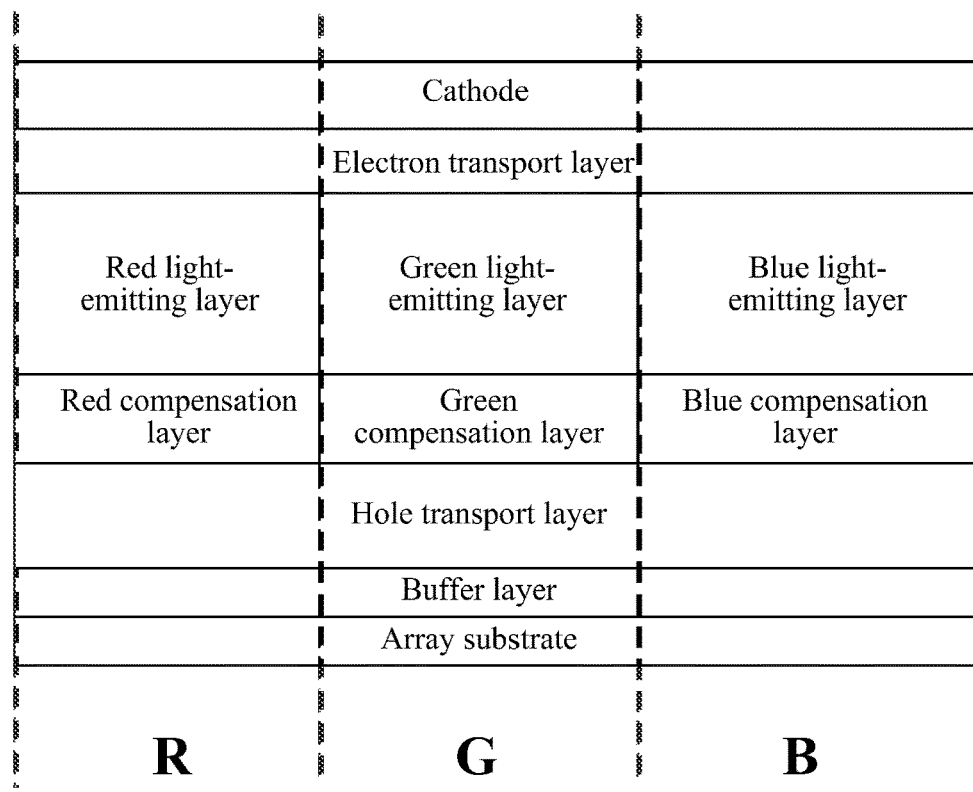
FIG. 1 is a diagram showing a film structure of an existing organic light emitting display panel.

The present disclosure will be further described in detail in conjunction with the drawings and embodiments below. It should be understood that the specific embodiments described herein are merely used for explaining the present disclosure and are not intended to limit the present disclosure. In addition, it should also be noted that, for ease of description, only some, but not all, of the structures related to the present disclosure are shown in the drawings.

FIG. 1 is a diagram showing a film structure of an existing organic light emitting display panel, first with reference to FIG. 1, light-emitting devices in the existing organic light-emitting display panel not only include red light-emitting devices, green light-emitting device and blue light-emitting device, but also each light-emitting device further includes a light-emitting layer and a compensation layer having a color corresponding to the light-emitting device. The shapes of the light-emitting layer and the compensation layer belonging to a same light-emitting device are completely the same, and each light-emitting device is actually a sub-pixel in the display panel. As described in the background art, multiple evaporation masks need to be designed when organic film layers such as a light-emitting layer and a compensation layer are prepared on an existing display panel, and if the shapes, the sizes and the arrangement modes of sub-pixels with different colors in the display panel are the same, patterns composed of sub-pixel openings in evaporation masks corresponding to the sub-pixels with different colors are substantially the same, and the difference is only that positions of offset mark openings disposed at the periphery are different. The evaporation masks belong to precise metal masks, the process of preparing the display panel by using the multiple evaporation masks is relatively complex in process, a number of the evaporation masks is relatively large, the cost is high, and thus the project cost is increased.

The embodiments of the present disclosure provide an evaporation mask for solving the above problems, and correspondingly provide a display panel, a display device and a preparation method thereof, the display panel and the preparation method are prepared by adopting the evaporation mask provided in the embodiments of the present disclosure. Firstly, the display panel includes a display region and a non-display region located at a periphery of the display region; the display region includes multiple first sub-pixels and multiple second sub-pixels, and the multiple first sub-pixels and the multiple second sub-pixels have a same shape and a same size and are different in color; a pattern composed of the multiple first sub-pixels is at least partially consistent with a pattern composed of the multiple second sub-pixels, and at least part patterns of mutually consistent patterns are staggered in a first direction, and $\vec{d_1}$ denotes a staggered vector in the first direction; and the non-display region includes a first offset mark A1 and a second offset mark A2; the first offset mark A1 and the second offset mark A2 are disposed in the first direction, $\vec{H_1}$ denotes a vector connecting a center of the first offset mark A1 and a center of the second offset mark A2, and the vector $\vec{H_1}$ satisfies: $\vec{H_1} = \vec{d_1} + \vec{t_1}$. Where $\vec{t_1}$ denotes a first preset deviation, and $|\vec{t_1}| \leq 10$ μm.

Figure 2:
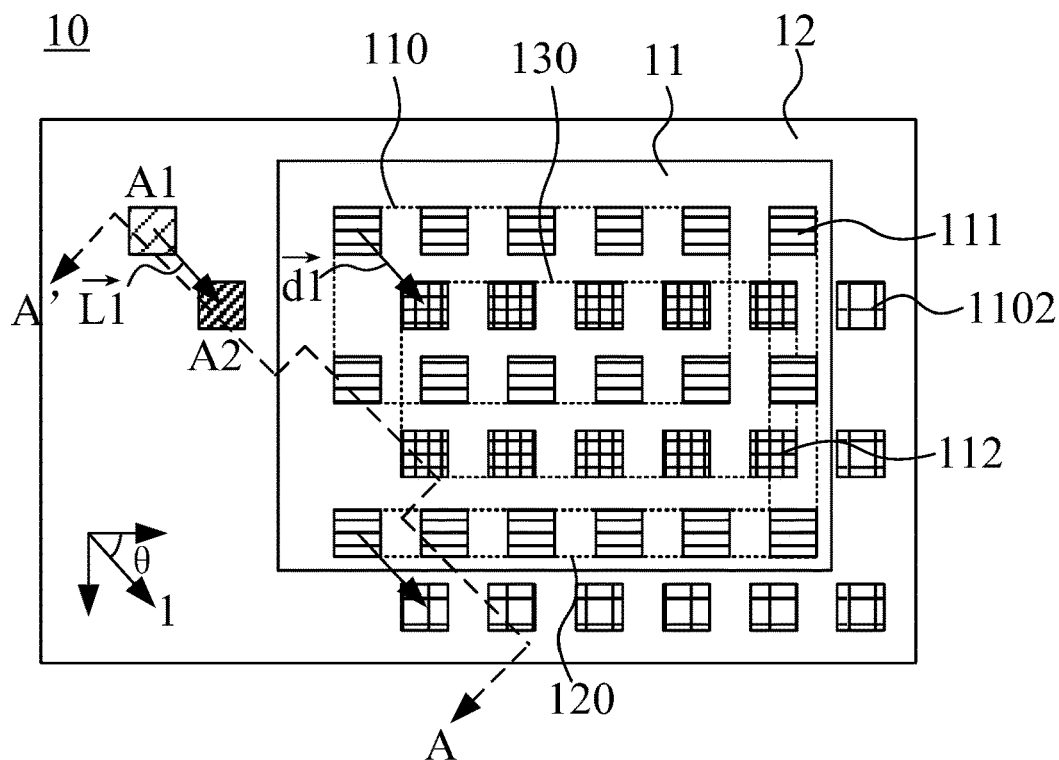
FIG. 2 is a partial structural diagram of a display panel provided in an embodiment of the present disclosure.

A display panel provided in an embodiment of the present disclosure with reference to the drawings is described as follows. FIG. 2 is a partial structural diagram of a display panel provided in an embodiment of the present disclosure, with reference to FIG. 2, the display panel 10 includes a display region 11 and a non-display region 12 located at a periphery of the display region 11; the display region 11 includes multiple first sub-pixels 111 and multiple second sub-pixels 112, and the multiple first sub-pixels 111 and the multiple second sub-pixels 112 have a same shape and a same size and are different in color; a pattern composed of the multiple first sub-pixels 111 is at least partially consistent with a pattern composed of the multiple second sub-pixels 112, and at least part patterns of mutually consistent patterns are staggered in a first direction 1, and $\vec{di}$ denotes a staggered vector in the first direction; and the non-display region 12 includes a first offset mark A1 and a second offset mark A2; the first offset mark A1 and the second offset mark A2 are disposed in the first direction 1, $\vec{Li}$ denotes a vector connecting a center of the first offset mark A1 and a center of the second offset mark A2, and the vector $\vec{Li}$ satisfies: $\vec{Li} = \vec{di} + \vec{ti}$; where $\vec{ti}$ denotes a first preset deviation, and $\vec{ti} \leq 10$ μm.

It should be understood by those skilled in the art that when pixel units are configured in an existing display panel, sub-pixels with different colors, such as red sub-pixels, green sub-pixels and blue sub-pixels are configured in the pixel units, and multiple pixel units are sequentially disposed in a row direction and a column direction to form a pixel unit array. In each pixel unit, relative positions of the sub-pixels with red, green and blue are consistent, so that an arrangement of the sub-pixels is also an array arrangement from the arrangement of sub-pixels with a certain color. For an array formed by the sub-pixels with different colors, the shapes and sizes of the sub-pixels are the same, and the colors of the sub-pixels are different, so that the array formed by the sub-pixels with different colors may satisfy a condition that part of patterns are consistent. In the embodiments of the present disclosure, for example, the first sub-pixel 111 may be taken as a red sub-pixel, the second sub-pixel 112 may be taken as a green sub-pixel, and a pattern composed of the first sub-pixels 111 is at least partially consistent with a pattern composed of the second sub-pixels 112. That is, it represents that an array composed of the red sub-pixels is at least partially consistent with an array composed of the green sub-pixels, and at least part of patterns in mutually consistent patterns are staggered in the first direction 1, which means that same parts in the array composed of the red sub-pixels and the array composed of the green sub-pixels may be overlapped by shifting in the first direction 1. Where the staggered vector $\vec{di}$ includes both a direction of the shift, i.e., the first direction 1, and a distance of the shift, and patterns of same parts of the first sub-pixels 111 and the second sub-pixels 112 may be superposed by shifting according to the staggered vector $\vec{di}$.

The offset mark actually refers to a graphic mark formed in the non-display region 12 of the display panel, the offset mark and an organic film layer of the sub-pixel are formed in a same evaporation step by adopting a same evaporation mask, that is, a relative position of an offset mark graph and a sub-pixel graph is fixed. When the evaporation mask and the array substrate are inaccurate in alignment, the organic film layer of the sub-pixel formed by evaporation is staggered, and meanwhile, the offset mark is also staggered. Therefore, whether the organic film layer in the sub-pixel offsets or not may be determined by detecting a deviation between the position of the deviation mark and a theoretical position.

In the display panel provided in the embodiments of the present disclosure, a forming principle of the first offset mark A1 and the second offset mark A2 and a specific process of detecting an offset according to the offset mark are introduced. Firstly, the pattern composed of the first sub-pixels 111 is at least partially consistent with the pattern composed of the second sub-pixels 112 in the display panel provided in the embodiments of the present disclosure, and at least part of the patterns may be overlapped through shifting in the first direction 1, so that in the embodiments of the present disclosure, the parts which may be overlapped through the shifting are prepared by a same evaporation mask in two evaporation processes, at least part of patterns in the patterns composed of the sub-pixel openings of the evaporation mask are consistent with the sub-pixel patterns of the overlapped part described above, and therefore a number of the evaporation masks may be reduced. Meanwhile, in order to detect a film layer offset condition prepared in the evaporation process, in this embodiment, the offset mark opening is disposed at the periphery of the sub-pixel opening pattern of the evaporation mask, and the offset mark opening is used for forming the offset mark while the organic film layer of the sub-pixel is prepared. Obviously, while organic film layers of the first sub-pixel 111 and the second sub-pixel 112 are respectively prepared, two offset mark openings, namely the first offset mark A1 and the second offset mark A2, may be respectively formed in the non-display region 12 of the display panel 10, and an offset condition of the organic film layer in the first sub-pixel 111 and an offset condition of the organic film layer in the second sub-pixel 112 may be correspondingly measured according to the two offset mark openings, an offset of the first offset mark A1 is an offset of the organic film layer in the first sub-pixel 111, and an offset of the second offset mark A2 is an offset of the organic film layer in the second sub-pixel 112.

It should be noted that, since the first offset mark A1 and the second offset mark A2 are formed in two evaporation processes by adopting a same evaporation mask, after the evaporation mask is shifted, it needs to be guaranteed that the sub-pixel opening in the evaporation mask is still aligned with a pixel definition unit on the array substrate so as to form the organic film layer of the sub-pixel. Therefore, a center-to-center distance of the two offset marks, i.e., a shift distance of the evaporation mask generated in the two evaporation processes, needs to be set to be the same as a staggered distance of the mutually coincident patterns of the first sub-pixel 111 and the second sub-pixel 112, i.e., the evaporation mask should be shifted according to the staggered vector $\vec{di}$ in the two evaporation processes. Furthermore, it should be understood that during an actual process preparation, there may be a problem of insufficient shift accuracy when the evaporation mask is shifted in a second evaporation process, i.e., a process error may be introduced in a center-to-center spacing of the first offset mark A1 and the second offset mark A2 when the evaporation mask is shifted. Therefore, from the perspective of strict measurement, an actual distance between the formed first offset mark A1 and the formed second offset mark A2 is equal to the staggered distance+/−the process error of at least part of patterns in the mutually consistent patterns of the first sub-pixel and the second sub-pixel. In this embodiment, since the shifted process error includes not only a distance error but also a direction error, the vector $\vec{Li}$ connecting the center of the first offset mark A1 and the center of the second offset mark A2 satisfies: $\vec{Li} = \vec{di} + \vec{ti}$; where $\vec{ti}$ denotes a first preset deviation, namely a preset process error value, and the $\vec{ti}$ includes the distance error and further includes the direction error. An absolute value of $\vec{ti}$, i.e., the distance error, may be selected to be a value less than or equal to 10 μm and greater than or equal to 0.

It should be noted that as FIG. 2 only illustrates that the display panel includes two sub-pixels, i.e., the first sub-pixel 111 and the second sub-pixel 112, the display panel in the embodiments of the present disclosure should not be limited to sub-pixels with two colors. Moreover, in a practical display panel, the number and the spacing of sub-pixels in colors such as red, green and blue need to be designed according to the size and the resolution of the panel, and an area of the display region is far larger than an area of the non-display region. The number, the arrangement position, the arrangement pitch, and the like of the first sub-pixels 111 and the second sub-pixels 112 and an area ratio of the display region and the non-display region in this embodiment are merely for convenience of illustration and are not limiting. In addition, in this embodiment, the first direction 1, which is a staggered direction of consistent parts between the pattern composed of the first sub-pixels and the pattern composed of the second sub-pixels 112, may be a direction making an included angle of 0 degrees with the row direction, where $0<\theta<90°$, or may be a row direction or a column direction in which the pixels are disposed.

Based on the display panel described above, an embodiment of the present disclosure further provides a corresponding evaporation mask and a preparation method for preparing the display panel by adopting the evaporation mask. Firstly, it should be noted that in the embodiments of the present disclosure, the first sub-pixel 111 and the first offset mark A1 are prepared and formed by adopting a same evaporation mask in a same evaporation process; the second sub-pixel 112 and the second offset mark A2 are prepared and formed by adopting a same evaporation mask in a same evaporation process; and the first sub-pixel 111 and the first offset mark A1 as well as the second sub-pixel 112 and the second offset mark A2 are prepared and formed by adopting a same evaporation mask in different evaporation processes.

Figure 3:
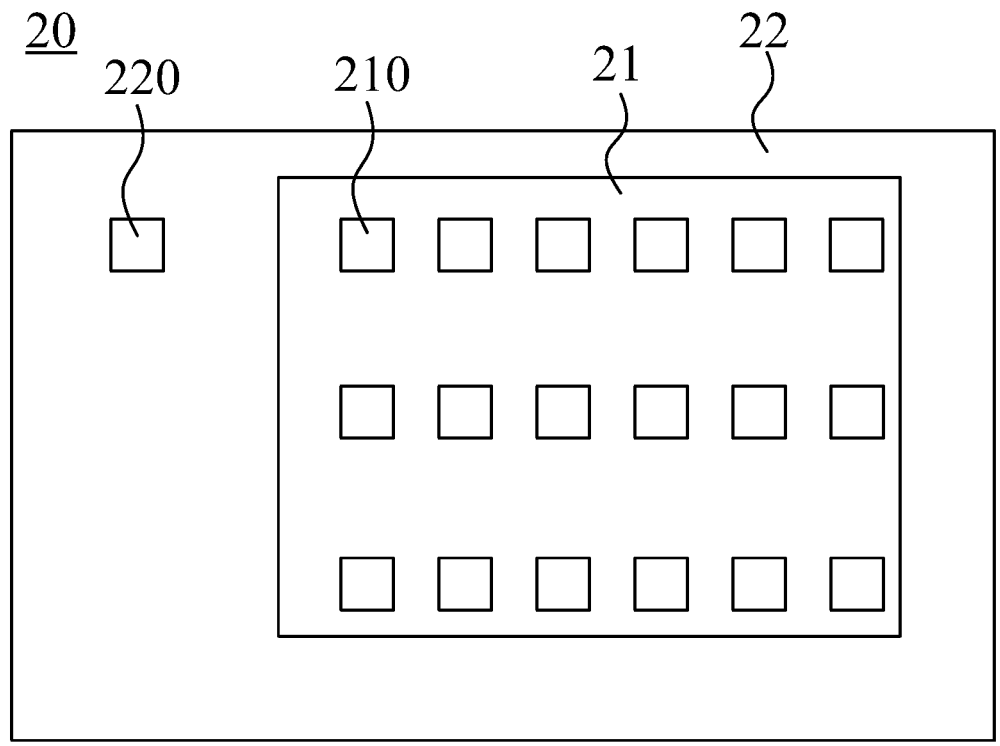
FIG. 3 is a structural diagram of an evaporation mask provided in an embodiment of the present disclosure.

The evaporation mask and the preparation method of the display panel provided in the embodiments of the present disclosure are specifically introduced by attached drawings. FIG. 3 is a structural diagram of an evaporation mask provided in an embodiment of the present disclosure, and with reference to FIGS. 2 and 3, firstly, the evaporation mask is used for forming the display panel provided in the above embodiments; the evaporation mask 20 includes a first evaporation region 21 and a second evaporation region 22. The first evaporation region 21 includes multiple sub-pixel openings 210, and the sub-pixel openings 210 are used for preparing organic film layers of the first sub-pixels 111 and the second sub-pixels 112 in the display panel 10 in different evaporation processes, respectively. The second evaporation region 22 is located at a periphery of the first evaporation region 21, the second evaporation zone 22 includes an offset mark opening 220; and the offset mark opening 220 is used for preparing and forming the first offset mark A1 and the second offset mark A2 in the display panel 10 in different evaporation processes, respectively.

By comparing the sub-pixels and the sub-pixel openings as well as the offset marks and the offset mark openings shown in FIG. 2 and FIG. 3, it may be known that the pattern composed of the sub-pixel openings 210 in the evaporation mask 20 is not only consistent with the pattern composed of the first sub-pixels 111 in the display panel 10, but also partially consistent with the pattern composed of the second sub-pixels 112 in the display panel 10. Similarly, the offset mark opening 220 in the evaporation mask 20 is not only consistent with the pattern of the first offset mark A1 in the display panel 10, but also is consistent with the pattern of the second offset mark A2 in the display panel 10.

Figure 4:
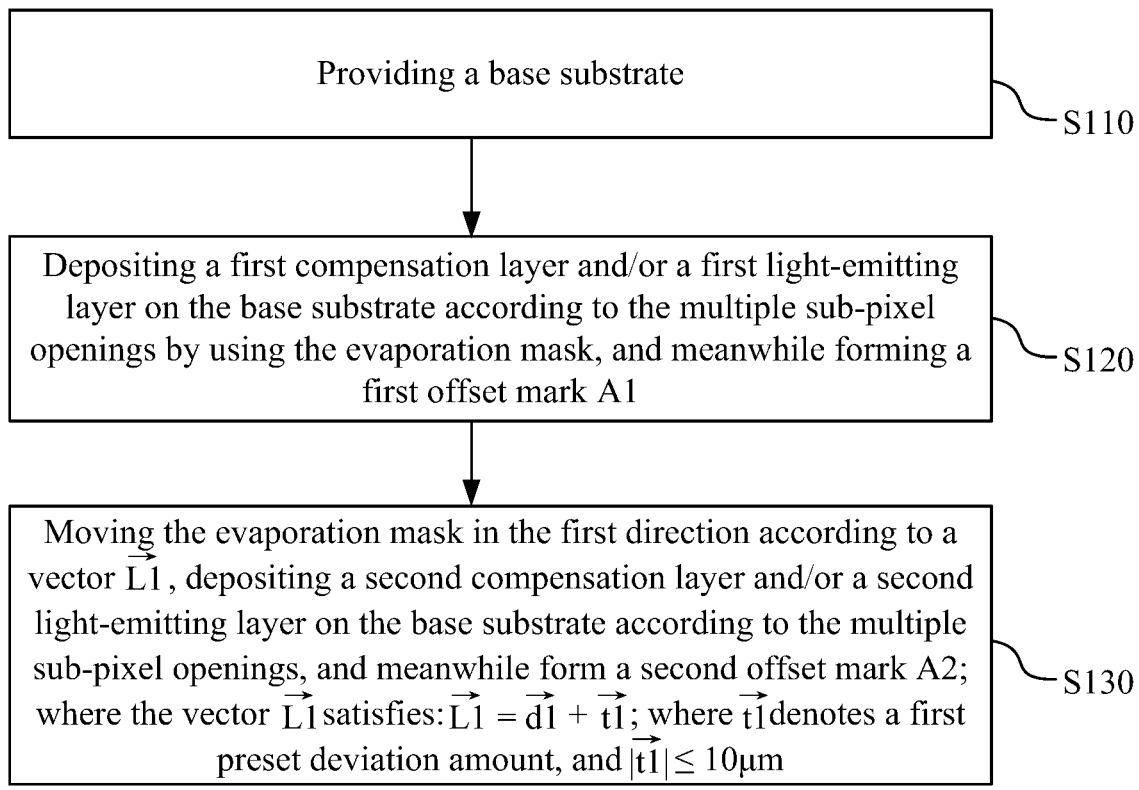
FIG. 4 is a preparation method of a display panel provided in an embodiment of the present disclosure.
Figure 5:
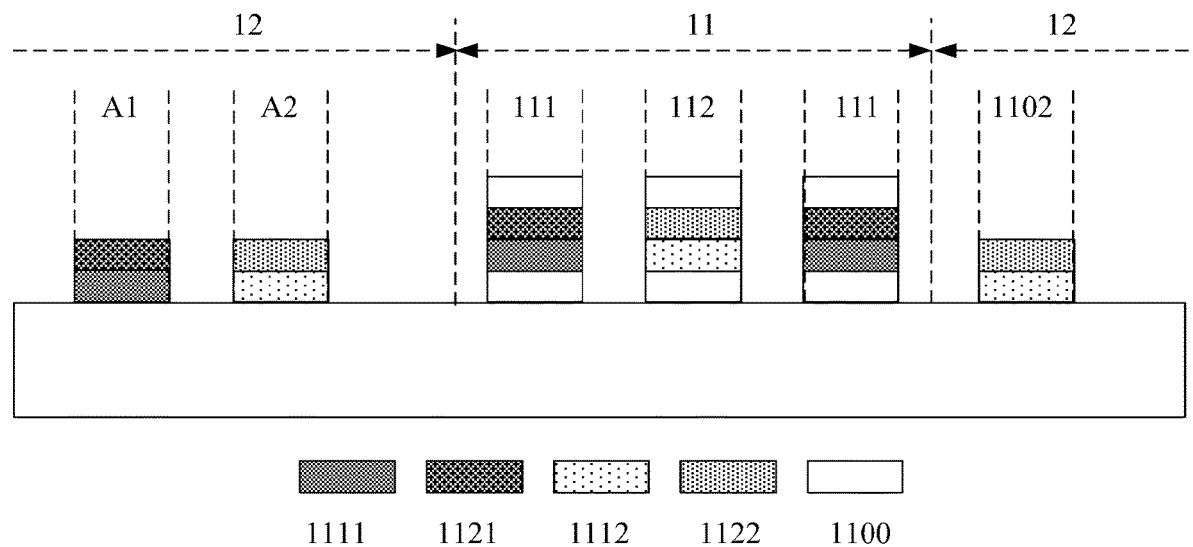
FIG. 5 is a cross-sectional view of the display panel shown in FIG. 2 along AA'.
Figure 6:
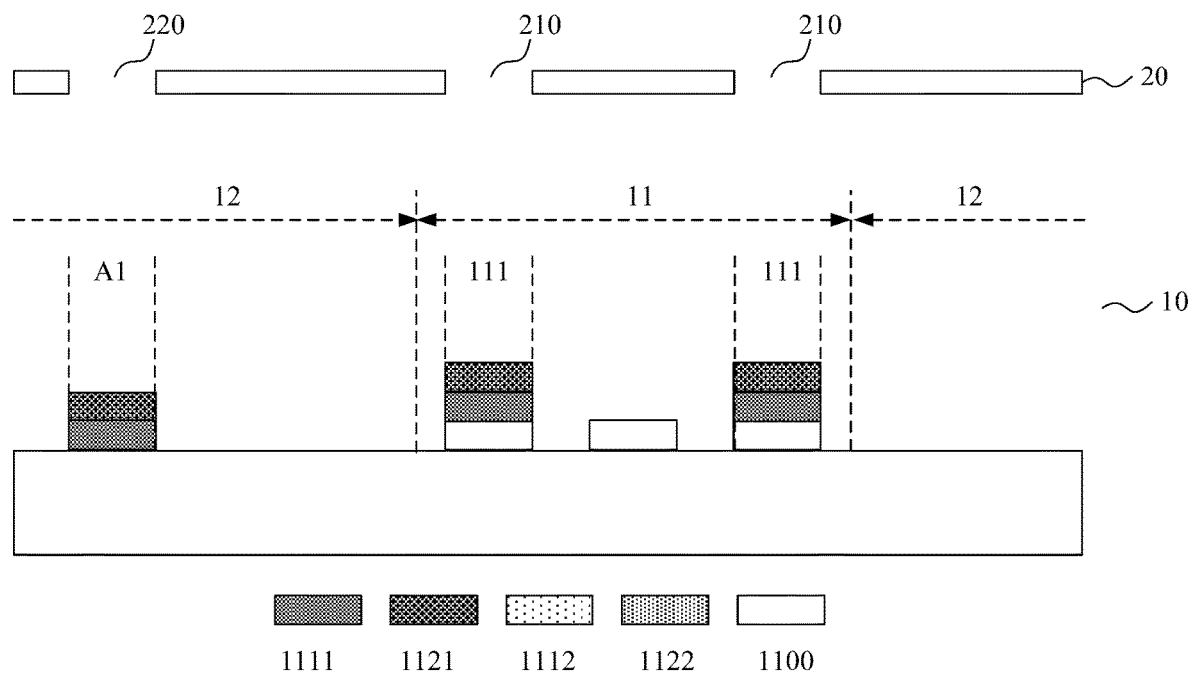
FIGS. 6 and 7 are cross-sectional views showing various steps in the preparation method of the display panel shown in FIG. 4.
Figure 7:
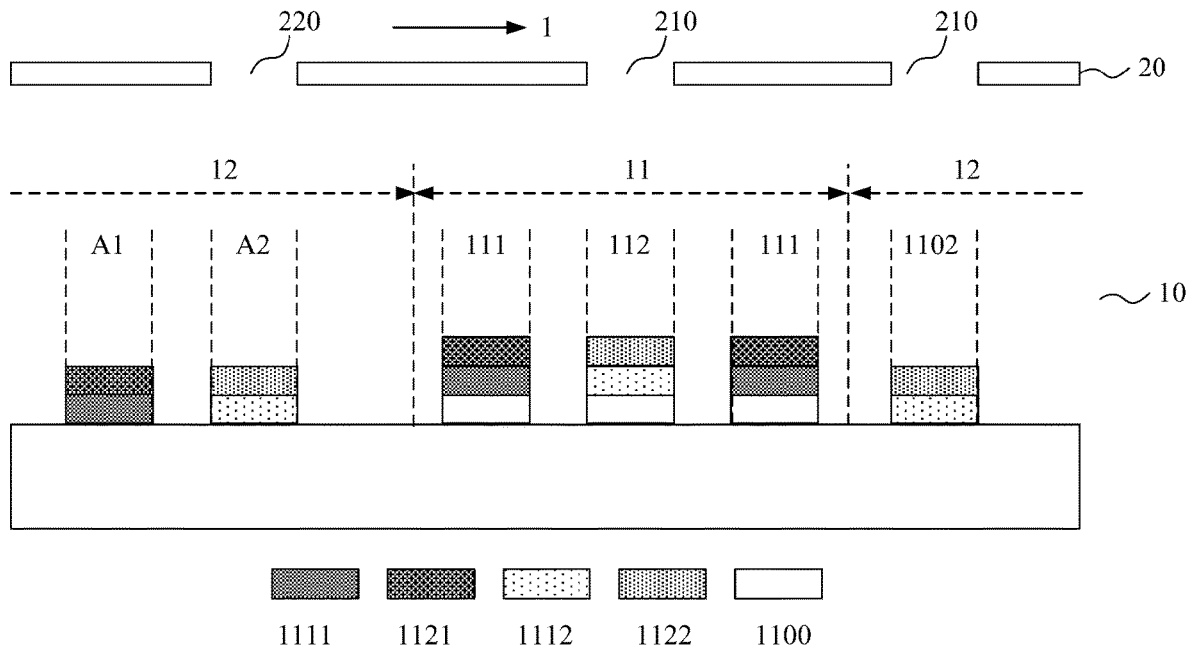

FIG. 4 is a preparation method of a display panel provided in an embodiment of the present disclosure; FIG. 5 is a cross-sectional view of the display panel shown in FIG. 2 along AA', and FIGS. 6 and 7 are cross-sectional views showing various steps in the preparation method of the display panel shown in FIG. 4, with reference to FIGS. 2 to 7, the preparation method of the display panel adopts the evaporation mask described above to prepare the display panel described above, and the preparation method of the display panel includes described below.

In S110, a base substrate is provided.

The base substrate is substantially a substrate for forming a pixel driving circuit and a part of film layers of a sub-pixel. According to this embodiment, the premise that a same evaporation mask is adopted for preparing the two offset marks is that the display panel includes sub-pixels having two colors with at least partially consistent patterns, for example, the patterns composed of a red sub-pixel and a green sub-pixel are at least partially consistent. It should be noted that the organic film layer in the light-emitting device may generally include a light-emitting layer and a compensation layer, and the base substrate referred to in this embodiment is essentially a substrate before the light-emitting layer and the compensation layer are prepared.

In S120, a first compensation layer 1111 and/or a first light-emitting layer 1121 is deposited on the base substrate according to the multiple sub-pixel openings 210 by using the evaporation mask 20, and meanwhile a first offset mark A1 is formed.

With reference to FIGS. 5 and 6, in this step, the evaporation mask 20 is aligned with the base substrate at a first position. At this time, the evaporation mask 20 is aligned with a pixel definition unit (not shown in the drawings) corresponding to the first sub-pixel 111 on the base substrate, and the first compensation layer 1111 or the first light-emitting layer 1121 may be formed by deposition of an organic material. Meanwhile, the offset mark opening 220 disposed in the second evaporation region 22 of the evaporation mask 20 may form the first offset mark A1 by deposition of the organic material.

As shown in FIG. 5 and FIG. 6, it should be noted that the compensation material and the light-emitting material in the first sub-pixel 111 are sequentially deposited by using this evaporation mask 20 in a first alignment stage. In such way, the laminated first compensation layer 1111 and the first light-emitting layer 1121 are formed, and the first offset mark A1 also includes two laminated film layers formed by the compensation material and the light-emitting material. It should be noted that when the compensation material and the light-emitting material are sequentially evaporated in this step, since the evaporation mask 20 is not moved, the patterns of the first compensation layer 1111 and the first light-emitting layer 1121 in a same sub-pixel are completely overlapped, and an offset of a pattern where the first compensation layer 1111 and the first light-emitting layer 1121 are laminated may be measured with the first offset mark A1. Of course, in other embodiments of the present disclosure, it is also possible to prepare only the first compensation layer 1111 adopting the evaporation mask 20, and correspondingly, the first offset mark A1 includes only one film layer formed of the compensation material, and the offset of the first compensation layer 1111 may be measured by using the first offset mark A1. Similarly, the evaporation mask 20 may be only used for preparing the first light-emitting layer 1121; and at this time, the base substrate in the step S110 should substantially be a substrate where the first compensation layer 1111 has been prepared, the first offset mark A1 only includes one layer of film layer formed of the light-emitting material, and an offset of the first light-emitting layer 1121 may be measured by using the first offset mark A1.

In S130, the evaporation mask 20 is moved in the first direction 1 according to a vector $\vec{H}$, a second compensation layer 1112 and/or a second light-emitting layer 1122 are deposited on the base substrate according to the multiple sub-pixel openings 210, and meanwhile a second offset mark A2 is formed; where the vector $\vec{L1}$ satisfies: $\vec{L1} = \vec{d1} + \vec{t1}$; where $\vec{t1}$ denotes a first preset deviation, and $|\vec{t1}| \leq 10$ µm.

With reference to FIGS. 5 and 7, in this step, the evaporation mask 20 is moved, which may be understood to be aligned with the base substrate at a second position. At this time, the evaporation mask 20 is aligned with a pixel definition unit (not shown in the drawings) in the second sub-pixel 112 on the base substrate, and the second compensation layer 1112 or the second light-emitting layer 1122 may be formed by deposition of the organic material. Meanwhile, the offset mark opening 220 disposed in the second evaporation region 22 of the evaporation mask 20 may form the second offset mark A2 by deposition of the organic material.

Similarly, as shown in FIG. 5 and FIG. 7, the compensation material and the light-emitting material in the second sub-pixel 111 are sequentially deposited by using this evaporation mask 20 in a second alignment stage. In such way, the laminated second compensation layer 1112 and the second light-emitting layer 1122 are formed, and the second offset mark A2 also includes two laminated film layers formed by the compensation material and the light-emitting material. With this second offset mark A2, the offset of the second compensation layer 1112 and the second light-emitting layer 1122 may be measured. In other embodiments of the present disclosure, it is also possible to prepare only the second compensation layer 1112 adopting the evaporation mask 20, and correspondingly, the second offset mark A2 includes only one film layer formed of the compensation material, and the offset of the second compensation layer 1112 may be measured by using the second offset mark A2. Similarly, the evaporation mask 20 may be only used for preparing the second light-emitting layer 1122, and at this time, the second offset mark A2 only includes one layer of film layer formed of the light-emitting material, and an offset of the second light-emitting layer 1122 may be measured by using the second offset mark A2.

The first compensation layer 1111 and the first light-emitting layer 1121 of the first sub-pixel 111 as well as the second compensation layer 1112 and the second light-emitting layer 1122 of the second sub-pixel 112 are formed in the display panel 10 by using the evaporation mask 20 as described in the steps S120 and S130. That is, the preparation of two key film layers of OLED devices in the first sub-pixel 111 and the second sub-pixel 112 is finished. Meanwhile, in the step S120 and the step S130, the first offset mark A1, the second offset mark A2 and the third offset mark A3 are formed in the non-display region 12 of the display panel by using the evaporation mask 20.

In the embodiments of the present disclosure, the evaporation mask is provided with the first evaporation region and the second evaporation region disposed at the periphery of the first evaporation region, the first evaporation region includes the multiple sub-pixel openings, and the multiple sub-pixel openings are used for respectively preparing the first sub-pixels and the second sub-pixels in the display panel in different evaporation processes. The second evaporation region includes an offset mark opening, one offset mark opening is used for preparing two offset marks in the display panel in two evaporation processes, respectively, and offset conditions of film layers formed in different evaporation processes may be monitored by detecting offsets of these two offset marks, respectively. According to this embodiment, problems of more evaporation masks and higher cost in the preparation process of an existing display panel are solved, different offset marks may be formed by shifting the evaporation mask, the accurate and effective measurement of an evaporation offset is achieved, precise metal masks are saved, and thus the cost of the evaporation offset measurement is greatly reduced.

In the display panel shown in FIG. 2, the pattern composed of the first sub-pixels 111 includes a first pattern 110 and a second pattern 120, the pattern composed of the second sub-pixels 112 includes a third pattern 130, and the first pattern 110 is the same as the third pattern 130; in the first direction 1, the third pattern 130 is staggered towards a first side of the first pattern 110 relative to the first pattern 110; and the second pattern 120 is disposed on the first side of the first pattern 110 in the first direction 1.

Firstly, the first direction 1 shown in the FIG. 2 is substantially a direction which is parallel to a light-emitting surface of the display panel and points from the upper left to the lower right, and of course, the first direction 1 may be any direction making an acute included angle with the row direction, or may be the row direction or the column direction. A direction shown in FIG. 2 is used as an example, at this time, the third pattern 130 is staggered towards a lower right side of the first pattern 110 relative to the first pattern 110, and the first side is the lower right side. However, in other embodiments of the present disclosure, the first side may be disposed as the upper left side, which is not shown in the drawings.

Further, still referring to FIG. 2, the non-display region 12 further includes multiple second virtual sub-pixels 1102, the multiple second sub-pixels 112 and the multiple second virtual sub-pixels 1102 are the same in shape, size and color; the second virtual sub-pixels 1102 are disposed on a first side (lower right side) of the second pattern 120 in the first direction 1; and the pattern composed of the first sub-pixels 111 is completely consistent with the pattern composed of the second sub-pixels 112 and the second virtual sub-pixels 1102.

Still referring to FIGS. 5 to 7, the first sub-pixel 111 includes a first compensation layer 1111, a first light-emitting layer 1121, and electrode layers 1100 disposed on both sides of the first compensation layer 1111 and the first light-emitting layer 1121 in a light-emitting direction, and the second sub-pixel includes a second compensation layer 1112, a second light-emitting layer 1122, and electrode layers 1100 disposed on both sides of the second compensation layer 1112 and the second light-emitting layer 1122 in the light-emitting direction. The non-display region 12 includes a second virtual sub-pixel 1102, and at this time, the second virtual sub-pixel 1102 includes the second compensation layer 1112 and/or the second light-emitting layer 1122, and does not include the electrode layer 1100.

The virtual sub-pixels are actually organic patterns synchronously formed in the evaporation process due to a fact that part of sub-pixel openings are disposed in the non-display region 12 of the display panel. For example, organic patterns formed by compensation materials, or organic patterns formed by organic light-emitting materials, or organic patterns formed by laminating two organic materials. The second virtual sub-pixel 1102 is used as an example, the second virtual sub-pixel 1102 may include at least one of the second compensation layer 1112 and the second light-emitting layer 1122. Since the display panel does not have other functional film layers for forming the light-emitting device in the non-display region 12 and circuit structures such as pixel driving circuit, the organic pattern, i.e., the virtual sub-pixel, has only the shape of the sub-pixel and does not have the function of the sub-pixel. It should be understood that since the first sub-pixel 111 and the second sub-pixel 112 are formed in different evaporation processes by adopting a same evaporation mask 20, the patterns formed in the two processes should be substantially the same. When a number of the first sub-pixels 111 in the display region 11 of the display panel is greater than the number of the second sub-pixels 112 in the display region 11 of the display panel, the partial redundant sub-pixel opening 210 is substantially disposed in the non-display region 112 of the display panel, whereby the second virtual sub-pixel 1102 are formed. A redundant portion of the first sub-pixel 111 relative to the second sub-pixel 112 forms the second pattern 120, the same portion as the second sub-pixel 112 forms the first pattern 110, and the same portion of the second sub-pixel 112 as the first sub-pixel 111 forms the third pattern 130. It should be understood that the first pattern 110 and the second pattern 120 in the display region 11, a pattern composed of the third pattern 130 in the display region 11 and the second virtual sub-pixel 1102 in the non-display region 12 should be identical to the pattern composed of the sub-pixel opening 210 in the evaporation mask 20, so that the pattern composed of the first sub-pixels 111 is completely consistent with the pattern composed of the second sub-pixels 112 and the second virtual sub-pixels 1102.

It should be further understood that when the second pattern 120, which is an additional sub-pixel of the first sub-pixels 111 relative to the second sub-pixels 112, is disposed on the lower right side of the first pattern 110, the second virtual sub-pixel 1102 is also disposed on the lower right side of the second pattern 120, that is, the third pattern 130 and the second pattern 120 are both disposed on the same side of the first pattern 120 in the shift direction. At this time, when the second sub-pixel 112 is prepared, the redundant sub-pixel opening 210 on the evaporation mask 20 forms the second virtual sub-pixel 1102 in the non-display region 12 on the lower right side of the display region 11 at the same time, so that the evaporation mask 20 may form the first sub-pixel 111 and the second sub-pixel 112 in two evaporation processes, respectively. When the third pattern 130 and the second pattern 120 are respectively disposed on different sides of the first pattern 120 in the shift direction, for example, when the second pattern 120, which is an additional sub-pixel of the first sub-pixels 111 relative to the second sub-pixels 112, is disposed on the upper left side of the first pattern 110. However, the third pattern 130 is disposed on the lower right side of the first pattern 110, and at this time, the patterns of the first sub-pixel 111 and the second sub-pixel 112 cannot be formed in two evaporation processes through one evaporation mask, respectively.

Figure 8:
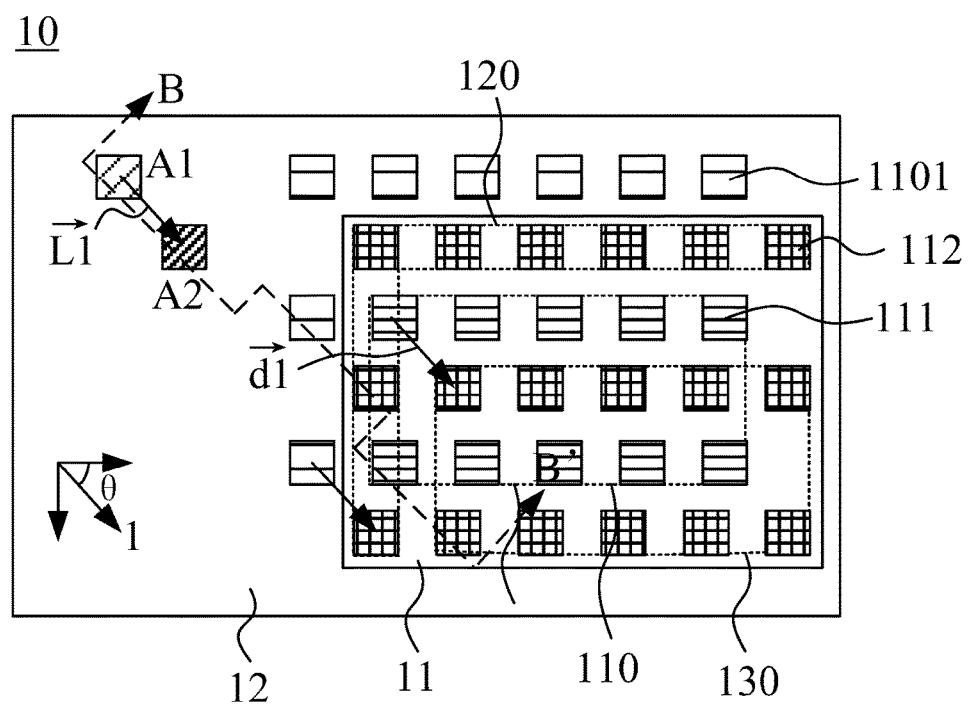
FIG. 8 is a structural diagram of another display panel provided in an embodiment of the present disclosure.
Figure 9:
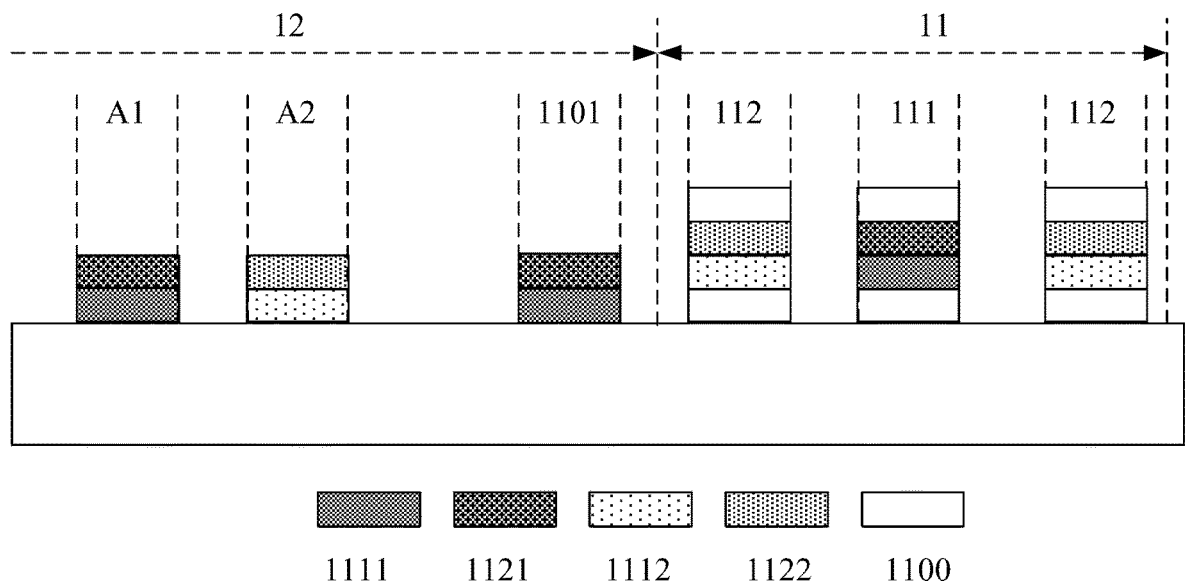
FIG. 9 is a cross-sectional view of the display panel shown in FIG. 8 along BB'.

FIG. 8 is a structural diagram of another display panel provided in an embodiment of the present disclosure, and FIG. 9 is a cross-sectional view of the display panel shown in FIG. 8 along BB', with reference. Referring to FIGS. 8 and 9, in another embodiment of the present disclosure, the pattern composed of the first sub-pixels 111 includes a first pattern 110, the pattern composed of the second sub-pixels 112 includes a second pattern 120 and a third pattern 130, and the first pattern 110 and the third pattern 130 are the same. In the first direction 1, the third pattern 130 is staggered towards a first side of the first pattern 110 relative to the first pattern 110; the second pattern 120 is disposed on a second side of the third pattern 130 in the first direction 1, and the first side and the second side are two sides facing away from each other in the first direction 1.

Further, still referring to FIGS. 8 and 9, the non-display region 12 further includes multiple first virtual sub-pixels 1101; the first sub-pixels 111 and the first virtual sub-pixels 1101 are the same in shape, size, and color; the first virtual sub-pixels 1101 are disposed on a second side of the second pattern 120 in the first direction 1; a pattern composed of the first virtual sub-pixels 1101 and the first sub-pixels 111 is completely consistent with the pattern composed of the second sub-pixels 112.

Optionally, the first sub-pixel 111 includes a first compensation layer 1111, a first light-emitting layer 1121, and electrode layers 1100 disposed on both sides of the first compensation layer 1111 and the first light-emitting layer 1121 in a light-emitting direction, and the second sub-pixel 112 includes a second compensation layer 1112, a second light-emitting layer 1122, and electrode layers 1100 disposed on both sides of the second compensation layer 1112 and the second light-emitting layer 1122 in the light-emitting direction. The non-display region 12 includes the first virtual sub-pixels 1101, and at this time, the first virtual sub-pixel 1101 includes the first compensation layer 1111 and/or the first light-emitting layer 1121 and does not include the electrode layer 1100.

Likewise, since the first sub-pixel 111 and the second sub-pixel 112 are formed in different evaporation processes by adopting a same evaporation mask 20, the patterns formed in these two processes should actually be the same. When the number of the first sub-pixels 111 in the display region 11 of the display panel is less than the number of the second sub-pixels 112, when the first sub-pixels 111 are prepared, redundant sub-pixel openings 210 in the evaporation mask are actually disposed in the non-display region 112 of the display panel correspondingly, and therefore the first virtual sub-pixels 1101 are formed.

A redundant portion of the second sub-pixel 112 relative to the first sub-pixel 111 forms the second pattern 120, the first sub-pixel 111 forms the first pattern 110, and the same portion as the second sub-pixel 112 and the first sub-pixel 111 forms the third pattern 130. It should be understood that the pattern composed of the first pattern 110 in the display region 11 and the first virtual sub-pixel 1101 in the non-display region 12 as well as the pattern composed of the second pattern 120 and the third pattern 130 in the display region 11 should be consistent with the pattern composed of the sub-pixel openings 210 in the evaporation mask 20, so that the pattern composed of the first sub-pixels 111 and the first virtual sub-pixels 1101 is completely consistent with the pattern composed of the second sub-pixels 112.

As shown in FIG. 8, in the first direction 1, the third pattern 130 is staggered towards the first side of the first pattern 110 relative to the first pattern 110, which represents that the first pattern 110 is disposed on the upper left side of the third pattern 130. The second pattern 120 is disposed on the second side of the third pattern 130 in the first direction 1, which represents that the second pattern 120 is disposed on the upper left side of the third pattern 130. It should be further understood that when the number of the second sub-pixels 112 is larger than the number of the first sub-pixels 111, the first pattern 110 is disposed on the upper left side of the third pattern 130, and the second pattern 120 is also disposed on the upper left side of the third pattern 130, i.e., the first pattern 110 and the second pattern 120 are disposed on a same side of the third pattern 130 in the shift direction, respectively. At this time, in the non-display region 12 on the upper left side of the display region 11, redundant sub-pixel openings are simultaneously prepared to form the first virtual sub-pixels 1101, so that the first sub-pixel 111 and the second sub-pixel 112 may be respectively formed by the evaporation mask in two evaporation processes. When the first pattern 110 and the second pattern 120 are respectively disposed on different sides of the third pattern 130 in the shift direction, for example, the second pattern 120, which is an additional sub-pixel of the second sub-pixels 112 relative to the first sub-pixel 111, is disposed on the lower right side of the third pattern 130, and the first pattern 110 is disposed on the lower right side of the third pattern 130, and at this time, the patterns of the first sub-pixels 111 and the second sub-pixels 112 cannot be formed in two evaporation processes through one evaporation mask.

Figure 10:
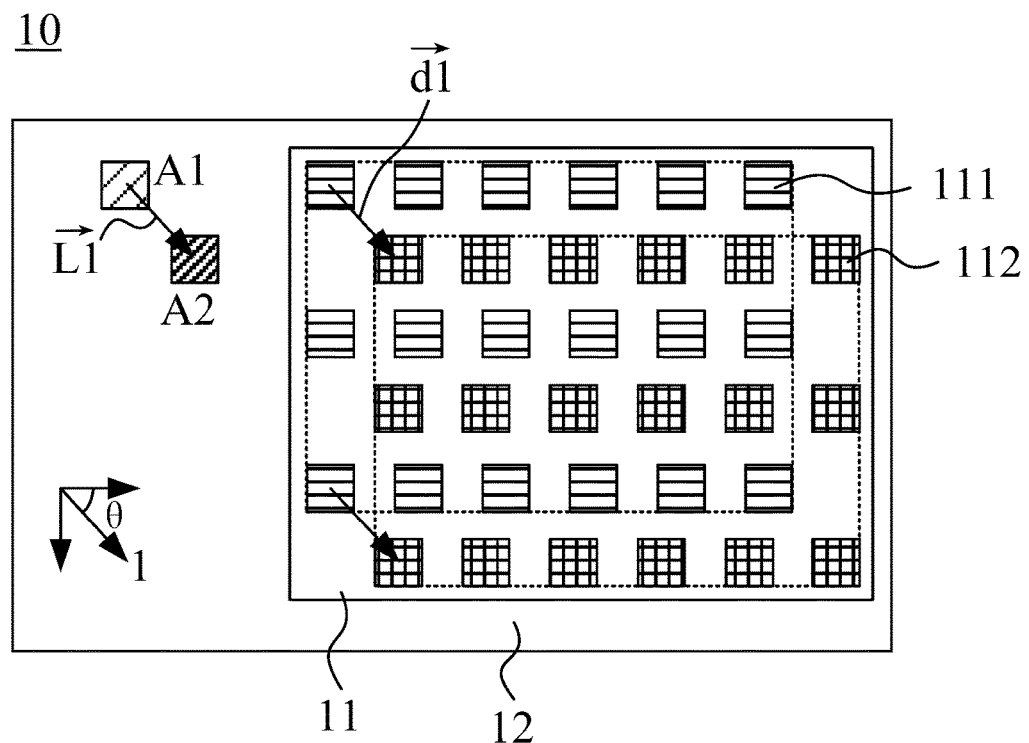
FIG. 10 is a structural diagram of another display panel provided in an embodiment of the present disclosure.

FIG. 10 is a structural diagram of another display panel provided in an embodiment of the present disclosure. Referring to FIG. 10, optionally, the pattern composed of the first sub-pixels 111 is completely consistent with the pattern composed of the second sub-pixels 112. At this time, the first sub-pixel 111 and the second sub-pixel 112 may be formed by evaporation through a direct displacement of the evaporation mask 20, and in the non-display region 12, two offset marks may be formed in two evaporation processes through displacement of the offset mark opening disposed on the evaporation mask. As described before, a vector $\vec{L1}$ formed through connecting the centers of the first offset mark A1 and the second offset mark A2 formed in the non-display region 12 satisfies: $\vec{L1} = \vec{d1} + \vec{t1}$; where $\vec{t1}$ denotes a first preset deviation, and $|\vec{t1}| \leq 10$ μm. Without considering the first preset deviation $\vec{t1}$ caused by a shift error, a distance connecting the centers of two offset marks should be equal to a relative distance between the pattern composed of the first sub-pixels 111 and the pattern composed of the second sub-pixels 112.

Figure 11:
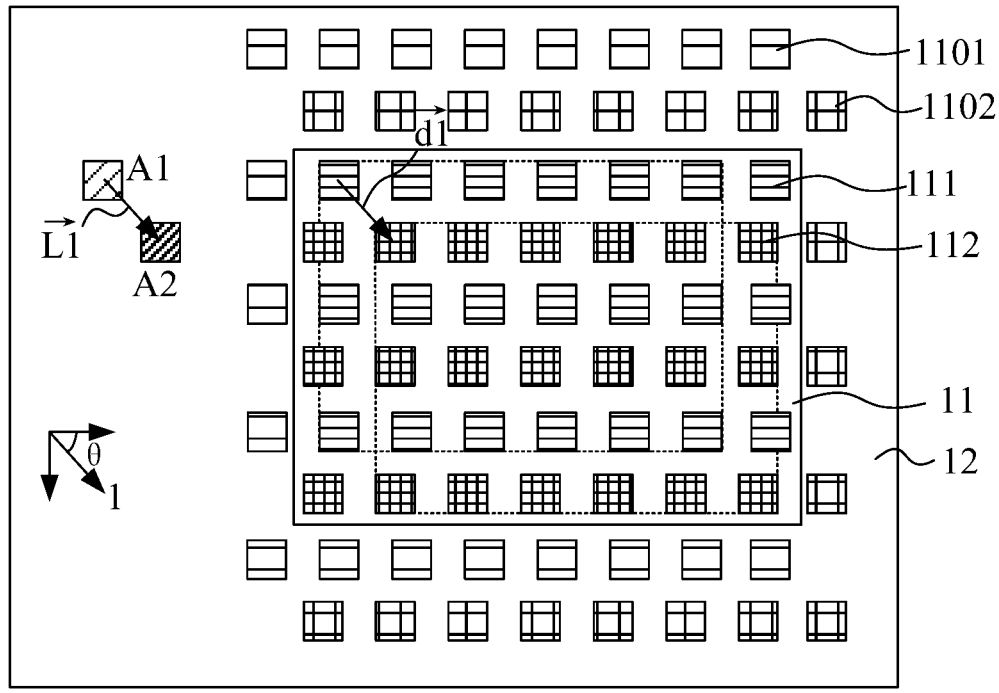
FIG. 11 is a structural diagram of another display panel provided in an embodiment of the present disclosure.

FIG. 11 is a structural diagram of another display panel provided in an embodiment of the present disclosure. With reference to FIG. 11, the non-display region 12 includes multiple first virtual sub-pixels 1101 and multiple second virtual sub-pixels 1102. The first virtual sub-pixels 1101 and the first sub-pixels 111 are the same in shape, size and color, and the second virtual sub-pixels 1102 and the second sub-pixels 112 are the same in shape, size and color. The first virtual sub-pixel 1101 and the second virtual sub-pixel 1102 are disposed around the display region 12. The pattern composed of the first virtual sub-pixels 1101 and the first sub-pixels 111 is at least partially consistent with the pattern composed of the second virtual sub-pixels 1102 and the second sub-pixels 112, and mutually consistent patterns include the pattern composed of the first sub-pixels 111 and the pattern composed of the second sub-pixel 112s.

In this embodiment, the number of sub-pixel openings of the evaporation mask will be greater than the number of the first sub-pixels 111 or the second sub-pixels 112 during design, i.e., more first virtual sub-pixels 1101 or second virtual sub-pixels 1102 will be formed in the non-display region 12 at the periphery of the display region 11 during evaporation of the first sub-pixels 111 or the second sub-pixels 112. For the evaporation mask, due to a fact that a number of the sub-pixel openings is relatively large, part of the sub-pixel openings of the evaporation mask may still be aligned with the pixel definition units corresponding to the second sub-pixels on the array substrate in the second evaporation process after shifting, and thus the second sub-pixels are formed through deposition. It should be understood that, due to the large number of sub-pixel openings, in a first evaporation process, the evaporation mask will not only form the first sub-pixel 111 in the display region, but also form the first virtual sub-pixel 1101 in the non-display region; however, in the second evaporation process, the evaporation mask not only forms the second sub-pixel 112 in the display region, but also forms the second virtual sub-pixel 1102 in the non-display region.

There may be part of the first virtual sub-pixel 1101 overlapping with the second virtual sub-pixel 1102, but also at least part of the first virtual sub-pixel 1101 and the second virtual sub-pixel 1102 do not overlap.

Figure 12:
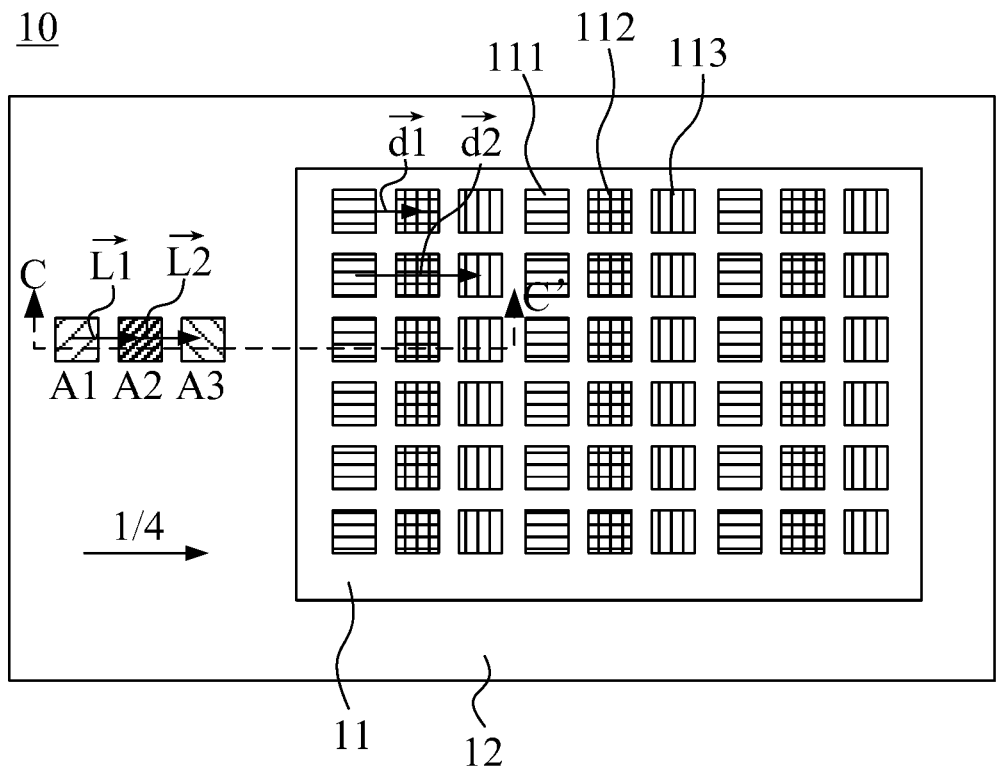
FIG. 12 is a structural diagram of another display panel provided in an embodiment of the present disclosure.

Since an existing display panel is usually composed of at least three sub-pixels including a red sub-pixel, a green sub-pixel and a blue sub-pixel, an embodiment of the present disclosure further provides a corresponding embodiment. FIG. 12 is a structural diagram of another display panel provided in an embodiment of the present disclosure. Referring to FIG. 12, on the basis of the above embodiments, the display region 11 in the display panel further includes multiple third sub-pixels 113, and the third sub-pixels 113 and the first sub-pixels 111 have a same shape and a same size, and the third sub-pixels 113 have a different color than the first sub-pixels 111 and the second sub-pixels 112. A pattern composed of the third sub-pixels 113 is at least partially consistent with a pattern composed of the first sub-pixels 111, at least part of mutually consistent patterns are staggered in a fourth direction 4, and $\vec{d2}$ denotes a stagged vector in the fourth direction. The non-display region 12 further includes a third offset mark A3; the first offset mark A1 and the third offset mark A3 are disposed in the fourth direction 4, $\vec{L2}$ denotes a vector connecting a center of the first offset mark A1 and a center of the third offset mark A3, and the vector $\vec{L2}$ satisfies: $\vec{L2} = \vec{d2} + \vec{t4}$; where $\vec{t4}$ is a fourth preset deviation, and $\vec{t4} \leq 10$ μm.

In this embodiment, the third sub-pixel 113 also satisfies a condition that the third sub-pixel 113 and the first sub-pixel 111 are shifted by adopting a same evaporation mask and then formed in two evaporation processes. In these two evaporation processes, a first offset mark A1 and a third offset mark A3 are respectively formed on a same offset mark opening in the evaporation mask. In other words, in this embodiment, the first sub-pixel 111 and the first offset mark A1 are prepared and formed by adopting a same evaporation mask in a same evaporation process, the third sub-pixel 113 and the third offset mark A3 are prepared and formed by adopting a same evaporation mask in a same evaporation process; and the first sub-pixel 111 and the first offset mark A1, as well as the third sub-pixel 113 and the third offset mark A3 are prepared and formed by adopting a same evaporation mask in different evaporation processes. A vector formed through connecting the center of the first offset mark A1 and the center of the second offset mark A3 is a displacement vector of the evaporation mask in the two evaporation processes. Likewise, considering that the evaporation mask may have a process error in the shifting process, a vector $\vec{L2}$ formed through connecting the center of the first offset mark A1 and the center of the second offset mark A3 should satisfy: $\vec{L2} = \vec{d2} + \vec{t4}$, and $\vec{t4}$ and $\vec{t1}$ are consistent in a direction range and a numerical range, which depends on the process error.

An existing display panel including a red sub-pixel, a green sub-pixel and a blue sub-pixel is used as an example, in this embodiment, a first sub-pixel 111, a second sub-pixel 112 and a third sub-pixel 113 may be set to be one of the red sub-pixel, the green sub-pixel and the blue sub-pixel, respectively; and the first offset mark A1, the second offset mark A2 and the third offset mark A3 are one of a first red offset mark A1, a second green offset mark A2 and a third blue offset mark A3, respectively.

It is further noted that the first direction 1 and the fourth direction 4 are both the row direction as shown in drawings, and in other embodiments of the present disclosure, the first direction 1 and the fourth direction may be the column direction, or the first direction 1 and the fourth direction may be a direction that forms an included angle of θ degrees with the row direction, where 0<θ<90°, which is not limited herein.

Figure 13:
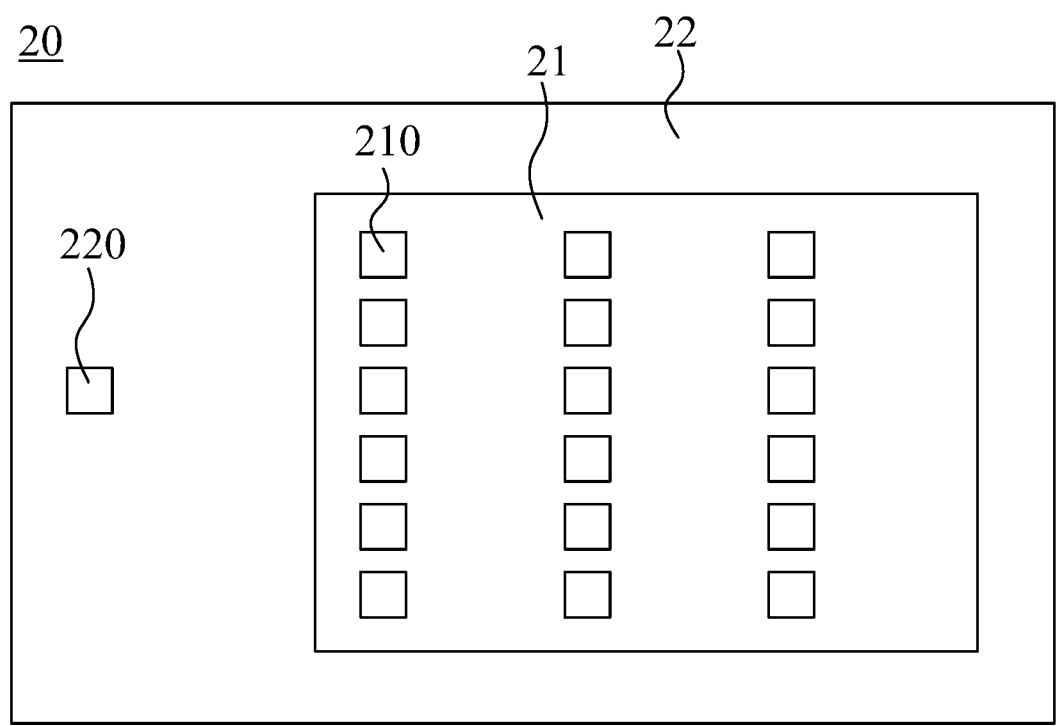
FIG. 13 is a structural diagram of an evaporation mask provided in an embodiment of the present disclosure.
Figure 14:
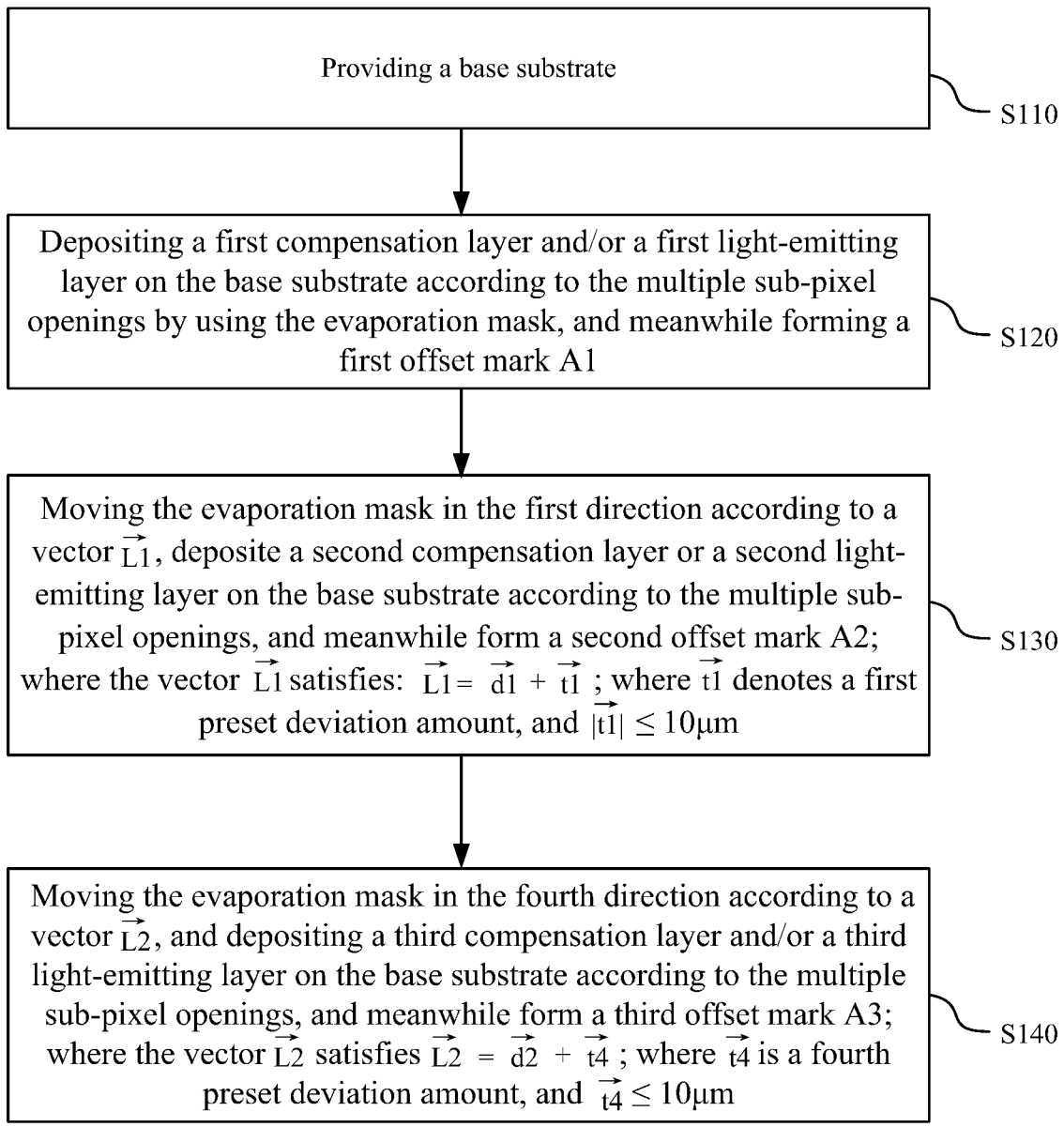
FIG. 14 is a preparation method of a display panel provided in an embodiment of the present disclosure.
Figure 15:
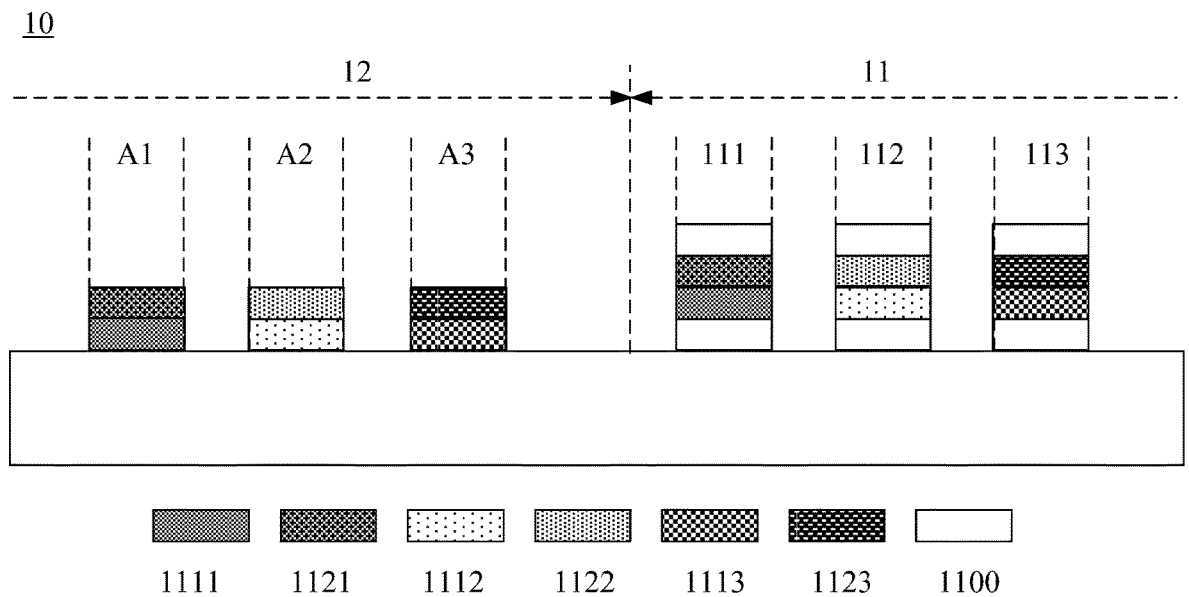
FIG. 15 is cross-sectional view of the display panel shown in FIG. 12 along CC'.
Figure 16:
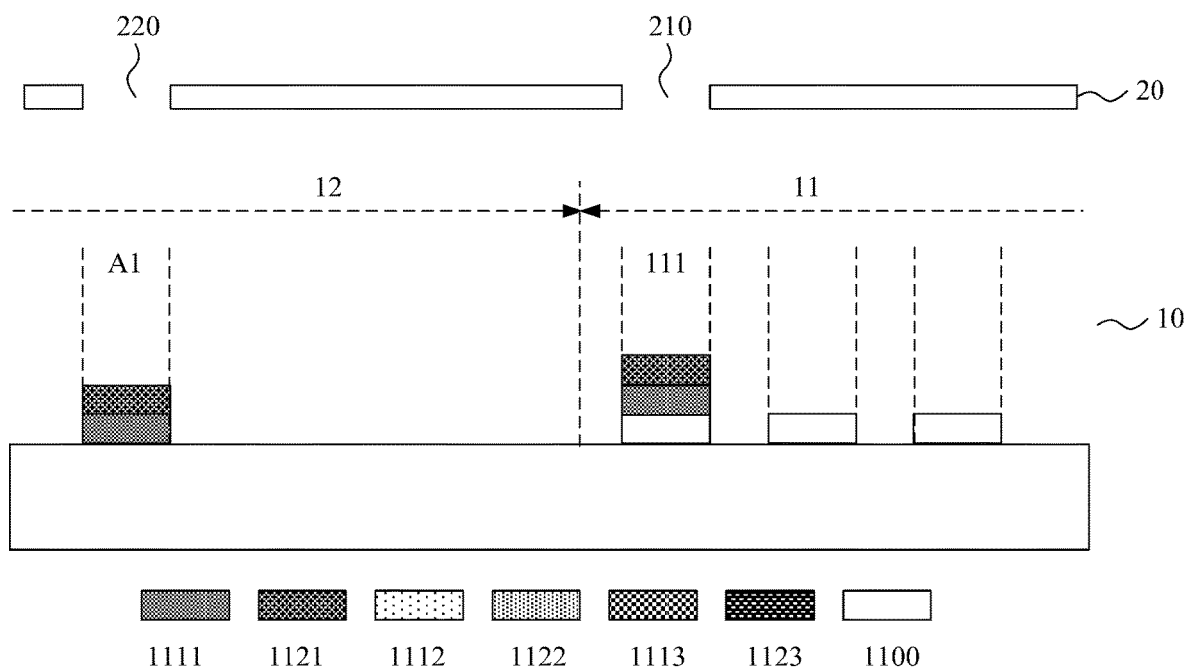
FIGS. 16 to 18 are cross-sectional views showing various steps in the preparation method of the display panel shown in FIG. 13.
Figure 17:
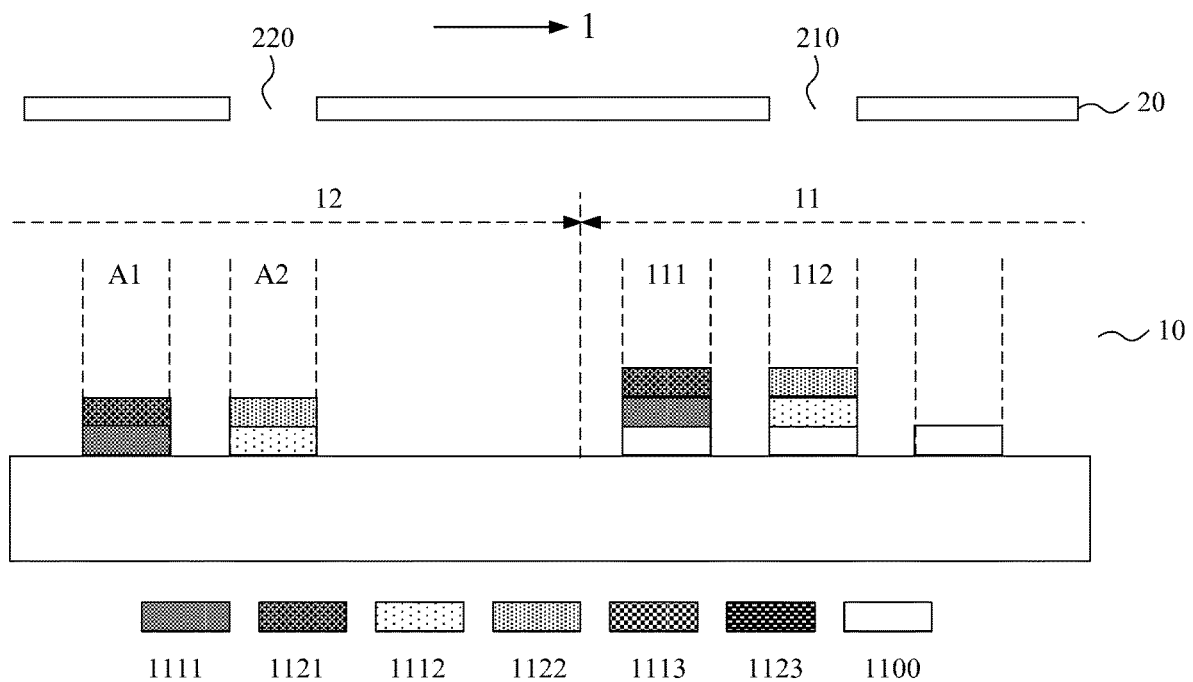
Figure 18:
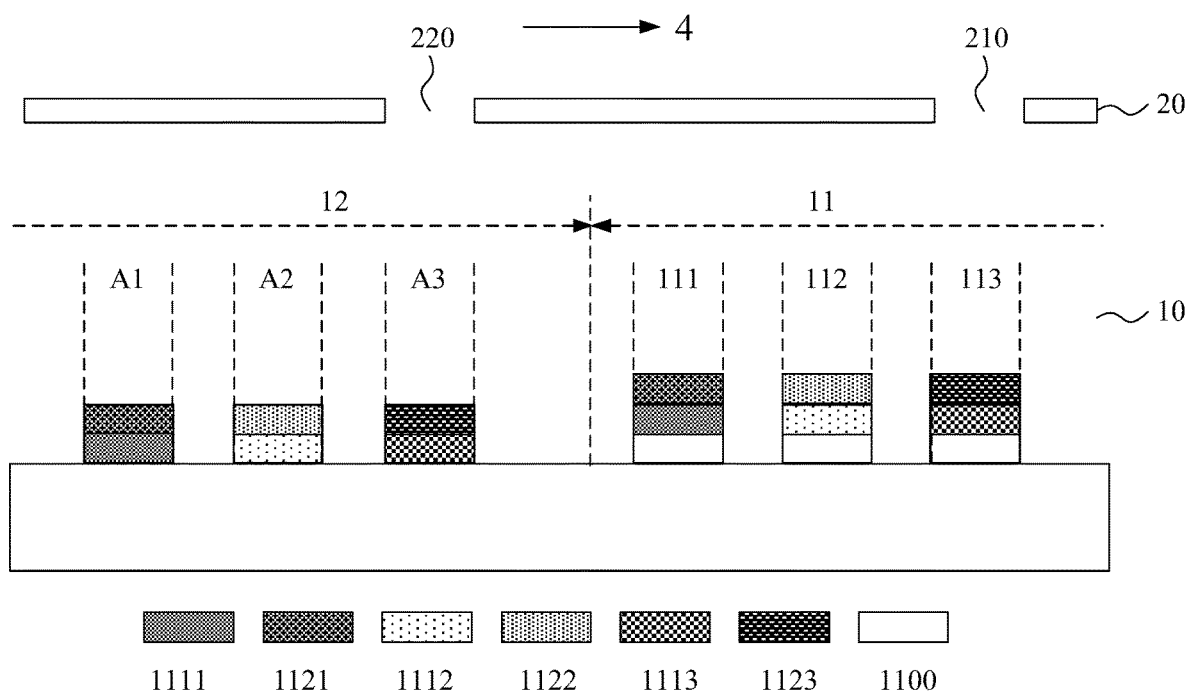

A preparation process of the display panel and a corresponding evaporation mask provided in the embodiments are explained below with reference to the drawings. FIG. 13 is a structural diagram of an evaporation mask provided in an embodiment of the present disclosure, FIG. 14 is a preparation method of a display panel provided in an embodiment of the present disclosure, and FIG. 15 is cross-sectional view of the display panel shown in FIG. 12 along CC'. FIGS. 16 to 18 are cross-sectional views showing various steps in the preparation method of the display panel shown in FIG. 13, referring to FIGS. 12 to 18, the preparation method of the display panel adopts the evaporation mask described above to prepare the display panel described above, and the preparation method of the display panel includes described below.

In S110, a base substrate is provided.

In S120, a first compensation layer 1111 and/or a first light-emitting layer 1121 is deposited on the base substrate according to the multiple sub-pixel openings 210 by using the evaporation mask 20, and meanwhile a first offset mark A1 is formed.

In S130, the evaporation mask 20 is moved in the first direction 1 according to a vector $\vec{L1}$, a second compensation layer 1112 or a second light-emitting layer 1122 is deposited on the base substrate according to the multiple sub-pixel openings 210, and meanwhile a second offset mark A2 is formed; where the vector $\vec{L1}$ satisfies: $\vec{L1} = \vec{t1} + \vec{t1'}$; where $\vec{t1'}$ denotes a first preset deviation, and $|\vec{t1'}| \le 10$ μm.

In S140, the evaporation mask is moved in the fourth direction according to a vector $\vec{L2}$, and a third compensation layer and/or a third light-emitting layer are deposited on the base substrate according to the multiple sub-pixel openings 210, and meanwhile a third offset mark A3 is formed; where the vector $\vec{L2}$ satisfies $\vec{d2} = \vec{L2} + \vec{t4}$; where $\vec{t4}$ is a fourth preset deviation, and $|\vec{t4}| \le 10$ μm.

With reference to FIGS. 15 to 17, in the steps S120 and S130, the first sub-pixel 111 and the second sub-pixel 112 are respectively formed in two evaporation processes by using a same evaporation mask, respectively, and the first offset mark A1 and the second offset mark A2 are also formed, respectively, which are not described in detail here. For the step S140, with reference to FIGS. 15 and 18, in this step, since the evaporation mask 20 is moved, it should be understood that the evaporation mask 20 is aligned with the base substrate at a third position, and at this time, the evaporation mask 20 is aligned with a pixel definition unit (not shown in the drawing) in a third sub-pixel 113 on the base substrate, and a third compensation layer 1113 or a third light-emitting layer 1123 may be formed by deposition of the organic material. Meanwhile, the offset mark opening 220 disposed in the second evaporation region 22 of the evaporation mask 20 may form the third offset mark A3 by the deposition of an organic material.

Similarly, as shown in FIG. 18, the compensation material and the light-emitting material in the third sub-pixel 113 are sequentially deposited by using adopting this evaporation mask 20 in this third alignment stage. In such way, the laminated third compensation layer 1113 and the third light-emitting layer 1123 are formed, and the third offset mark A3 also includes two laminated film layers formed by the compensation material and the light-emitting material are further included. With this third offset mark A3, an offset of the third compensation layer 1113 and the third light-emitting layer 1123 may be measured. In other embodiments of the present disclosure, it is also possible to prepare only the third compensation layer 1113 by adopting the evaporation mask 20, and correspondingly, the third offset mark A3 includes only one film layer formed of the compensation material, and an offset of the third compensation layer 1113 may be measured by using the third offset mark A3. Similarly, the evaporation mask 20 may be only used for preparing the third light-emitting layer 1123, and at this time, the third offset mark A3 only includes one layer of film layer formed of the light-emitting material, and the offset of the third light-emitting layer 1123 may be measured by using the third offset mark A3.

A first compensation layer 1111 and a first light-emitting layer 1121 of the first sub-pixel 111, a second compensation layer 1112 and a second light-emitting layer 1122 of the second sub-pixel 112, and a third compensation layer 1113 and a third light-emitting layer 1123 of the third sub-pixel 113 are formed in the display panel 10 by using the evaporation mask 20 in the steps S120 to S140, that is, the preparation of two key film layers of the OLED device in the first sub-pixel 111, the second sub-pixel 112 and the third sub-pixel 113 is completed. Meanwhile, in the steps S120 to S140, in the non-display region 12 of the display panel, the first offset mark A1, the second offset mark A2 and the third offset mark A3 are formed by using the evaporation mask 20.

Similar to the second sub-pixel, in the embodiments of the present disclosure, the pattern composed of the third sub-pixels may be set to be completely consistent with the pattern composed of the first sub-pixels, and at this time, after the evaporation mask completes the preparation of the first sub-pixels, a complete pattern of the third sub-pixel may be formed in the display region of the display panel through a direct displacement, and the number of the sub-pixel openings in the evaporation mask is consistent with the number of the first sub-pixels and the number of the third sub-pixels.

In another embodiment of the present disclosure, the pattern composed of the first sub-pixels includes a fourth pattern and a fifth pattern, the pattern composed of the third sub-pixels includes a sixth pattern, and the fourth pattern and the sixth pattern are the same; in the fourth direction, the fourth pattern is staggered towards a first side of the fourth pattern relative to the sixth pattern; and the fifth pattern is disposed on a first side of the fourth pattern in the fourth direction.

At this time, the number of the first sub-pixels is larger than the number of the third sub-pixels, and a portion of the first sub-pixels, which is more than the third sub-pixels, forms a fifth pattern. Correspondingly, when the third sub-pixel is prepared, redundant sub-pixel openings exist in the evaporation mask, so that a third virtual sub-pixel is formed in the non-display region. Specifically, the non-display region further includes multiple third virtual sub-pixels; the third sub-pixels and the third virtual sub-pixels are the same in shape, size and color; the third virtual sub-pixel is disposed on a first side of the fifth pattern in the fourth direction; and the pattern composed of the first sub-pixels is completely consistent with the pattern composed of the third sub-pixels and the third virtual sub-pixels.

In still another embodiment of the present disclosure, it may also be provided that the pattern composed of the first sub-pixels includes the fourth pattern, the pattern composed of the third sub-pixels includes the fifth pattern and the sixth pattern, and the fourth pattern and the sixth pattern are the same; in the fourth direction, the sixth pattern is staggered towards the first side of the fourth pattern relative to the fourth pattern; the fifth pattern is disposed on a second side of the sixth pattern in the fourth direction, and the first side and the second side are two sides facing away from each other in the fourth direction. At this time, the number of the third sub-pixels is larger than the number of the first sub-pixels, and a portion of the third sub-pixels, which is more than the first sub-pixels, form a fifth pattern. Correspondingly, when the first sub-pixel is prepared, redundant sub-pixel openings exist in the evaporation mask, so that a first virtual sub-pixel is formed in the non-display region. Specifically, the non-display region further includes multiple first virtual sub-pixels; the first sub-pixels and the first virtual sub-pixels are the same in shape, size and color; the first virtual sub-pixel is disposed on a second side of the fifth pattern in the first direction; and the pattern composed of the first virtual sub-pixels and the first sub-pixels is completely consistent with the pattern composed of the third sub-pixels.

In another embodiment of the present disclosure, multiple first virtual sub-pixels and multiple third virtual sub-pixels may be disposed in the non-display region; the first virtual sub-pixels and the first sub-pixels are the same in shape, size and color, and the third virtual sub-pixels and the third sub-pixels are the same in shape, size and color; the first virtual sub-pixels and the third virtual sub-pixels are disposed around the display region; the pattern composed of the first virtual sub-pixels and the first sub-pixels is at least partially consistent with the pattern composed of the third virtual sub-pixels and the third sub-pixels, and mutually consistent patterns include the pattern composed of the first sub-pixels and the pattern composed of the third sub-pixels.

In different embodiments described above, the first sub-pixel includes a first compensation layer, a first light-emitting layer, and electrode layers disposed on both sides of the first compensation layer and the first light-emitting layer in a light-emitting direction, and the third sub-pixel includes a third compensation layer, a third light-emitting layer, and electrode layers disposed on both sides of the third compensation layer and the third light-emitting layer in a light-emitting direction. When the non-display region includes a first virtual sub-pixel, the first virtual sub-pixel includes the first compensation layer and/or the first light-emitting layer and does not include the electrode layer; and when the non-display region includes a third virtual sub-pixel, the third virtual sub-pixel includes the third compensation layer and/or the third light-emitting layer and does not include the electrode layer.

The compensation layer and the light-emitting layer in a same sub-pixel also need corresponding offset marks for the offset measurement. Therefore, in the embodiments of the present disclosure, sub-pixels of a same color may be selected, and two evaporation masks are disposed to be respectively aligned to the pixel definition units of the sub-pixels and are used for respectively preparing the compensation layer and the light-emitting layer. It should be understood that the compensation layer and the light-emitting layer are prepared by adopting two evaporation masks, respectively, and the project cost is increased due to a fact that a number of the evaporation masks is relatively large. In an existing display panel, arrangement of sub-pixels of a same color has certain regularity, sub-pixel minimum repeating units composed of at least one sub-pixel exist in the panel, and for the sub-pixels of the same color, the sub-pixels are sequentially disposed in the row direction or the column direction of the display panel with the sub-pixel minimum repeating units as the minimum units. Therefore, for sub-pixels of one color, the compensation layer and the light-emitting layer in the sub-pixels are the same in pattern, the compensation layer and the light-emitting layer may be respectively prepared by shifting in two evaporation processes by adopting a same evaporation mask, and a sub-pixel opening in the shifted evaporation mask may still be aligned to the pixel definition unit.

Based on this, an embodiment of the present disclosure further provides a display panel, the display region in the display panel includes multiple first sub-pixel minimum repeating units and/or multiple second sub-pixel minimum repeating units, each of the multiple first sub-pixel minimum repeating units includes at least one first sub-pixel, and each of the multiple second sub-pixel minimum repeating units includes at least one second sub-pixel; the multiple first sub-pixel minimum repeating units are sequentially and periodically disposed in the second direction, and in the second direction, $\vec{c_1}$ denotes a vector connecting centers of any two adjacent first sub-pixel minimum repeating units; the multiple second sub-pixel minimum repeating units are sequentially and periodically disposed in the second direction, and in the second direction, $\vec{c_2}$ denotes a vector connecting centers of any two adjacent second sub-pixel minimum repeating units. The vector $\vec{c_1}$ and the vector $\vec{c_2}$ have a same direction and a same distance.

The non-display region further includes multiple first virtual sub-pixels and multiple second virtual sub-pixels, a pattern composed of the first sub-pixels and the first virtual sub-pixels is completely consistent with a pattern composed of the second sub-pixels and the second virtual sub-pixels, and is staggered in the third direction, and the staggered vector is $\vec{h_1}$. Where the staggered vector $\vec{d_1}$ satisfies: $\vec{d_1} = m1 \times \vec{c_2} + \vec{h_1}$, and m1 is an integer greater than or equal to 0.

Figure 19:
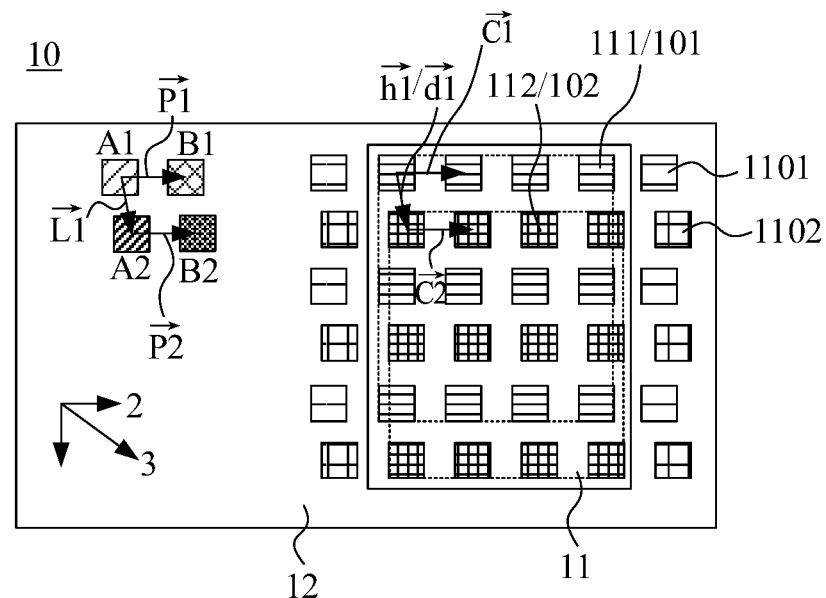
FIGS. 19 and 20 are structural diagrams of a display panel provided in an embodiment of the present disclosure.
Figure 20:
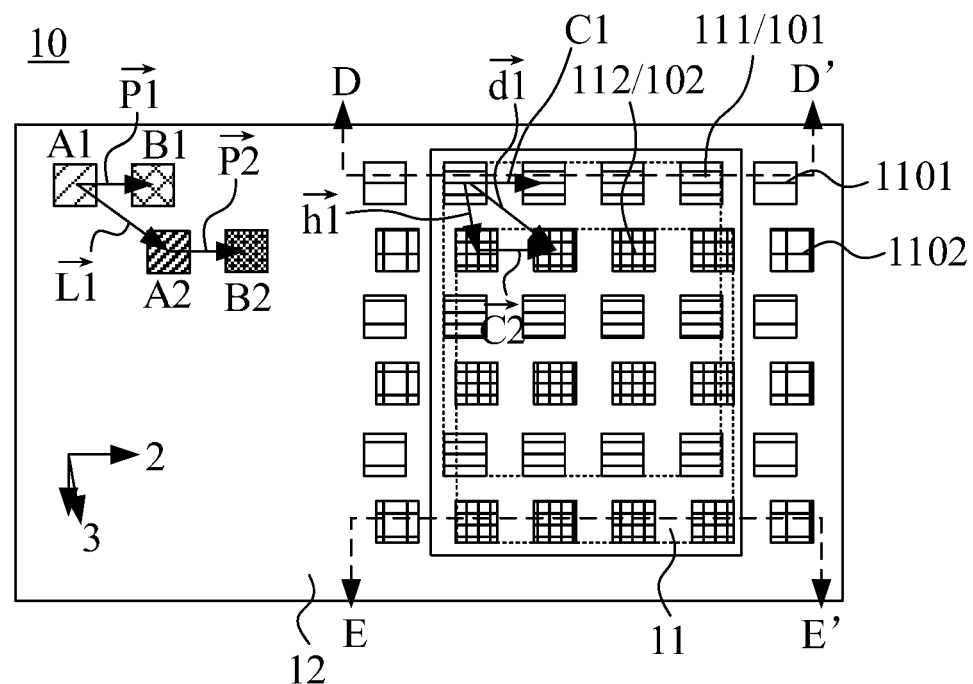

FIGS. 19 and 20 are structural diagrams of a display panel provided in an embodiment of the present disclosure. With reference to FIG. 19 and FIG. 20, in the two display panels, the display region 11 includes multiple first sub-pixel minimum repeating units 101 and multiple second sub-pixel minimum repeating units 102, each of the multiple first sub-pixel minimum repeating unit 101 includes at least one first sub-pixel 111, and each of the multiple second sub-pixel minimum repeating units 102 includes at least one second sub-pixel 111; the multiple first sub-pixel minimum repeating units 101 are sequentially and periodically disposed in the second direction 2, and in the second direction 2, $\vec{c_1}$ denotes a vector connecting centers of any two adjacent first sub-pixel minimum repeating units 101; the multiple second sub-pixel minimum repeating units 102 are sequentially and periodically disposed in the second direction 2, and in the second direction 2, $\vec{c_2}$ denotes a vector connecting centers of any two adjacent second sub-pixel minimum repeating units 102. The vector $\vec{c_1}$ and the vector $\vec{c_2}$ have a same direction and a same distance.

The non-display region 12 further includes multiple first virtual sub-pixels 1101 and multiple second virtual sub-pixels 1102, a pattern composed of the first sub-pixels 111 and the first virtual sub-pixels 1101 is completely consistent with a pattern composed of the second sub-pixels 112 and the second virtual sub-pixels 1102, and are staggered in a third direction 3, where $\vec{h_1}$ denotes a staggered vector in the third direction; the staggered vector $\vec{d_1}$ satisfies: $\vec{d_1} = m1 \times \vec{c_2} + \vec{h_1}$; where m1 is an integer greater than or equal to 0.

Referring to the second sub-pixel 112 of FIG. 19, exemplarily, the second sub-pixel minimum repetition unit 102 of the second sub-pixel 112 includes one second sub-pixel 112 disposed in the row direction, and the second direction 2 is the row direction. The pattern composed of the first sub-pixels 111 and the pattern composed of the second sub-pixels 112 may coincide after being shifted, so that one first sub-pixel 111 disposed in the row direction may also form a first sub-pixel minimum repeating unit 101. An arrangement period of the first sub-pixel minimum repeating unit 101 is completely consistent with an arrangement period of the second sub-pixel minimum repeating unit 102, so that a line connecting centers of two adjacent minimum repeating units corresponding to the first sub-pixel 111 and a center connecting centers of two adjacent sub-pixel minimum repeating units corresponding to the second sub-pixel 112 have a same direction and a same distance, that is, $\vec{c1}$ denotes vectors formed through connecting the centers. It should be understood that the pattern composed of the first sub-pixels 111 is consistent with the pattern composed of the second sub-pixels 112, so that after the first sub-pixels 111 are prepared in the first evaporation process, the evaporation mask may be directly shifted along the staggered vector $\vec{h1}$ of the pattern composed of the first sub-pixels 111 and the pattern composed of the second sub-pixels 112; and thus, the second sub-pixels 112 are prepared in the second evaporation step. With reference to FIG. 20, however, since the first sub-pixel 111 and the second sub-pixel 112 each have a sub-pixel minimum repeating unit, a self-shifting overlap may be achieved according to the vector $\vec{c1}$. In the embodiments of the present disclosure, in a process of shifting the evaporation mask before the second evaporation process, a shifting is performed according to the vector $\vec{h1}$ firstly and then a shifting is performed again according to an m1×vector $\vec{c1}$, m1 is an integer greater than or equal to 0. At this time, the sub-pixel opening in the evaporation mask may still be aligned with the pixel definition unit corresponding to the second sub-pixel on the array substrate, and thus the second sub-pixels 112 are prepared and formed. It should be understood that the two-shift process described above may in fact be implemented in one shift, i.e. may be implemented according to a shifting of the vector $\vec{d1}$, where $\vec{d1}$ =m1× $\vec{c1}$ + $\vec{h1}$. A pattern composed of first sub-pixels formed in the first evaporation process of the evaporation mask and a pattern composed of second sub-pixels formed in the second evaporation process of the evaporation mask are theoretically staggered along the vector $\vec{d1}$, and a central connecting line of the first offset mark A1 and the second offset mark A2 formed in the two evaporation processes is theoretically also the vector d1. Of course, considering a problem of a shift process error, a vector $\vec{L1}$ connecting the center of the first offset mark A1 and the center of the second offset mark A2 satisfies: $\vec{L1}$ = $\vec{d1}$ + $\vec{t1}$; where $\vec{t1}$ denotes a first preset deviation, and | $\vec{t1}$ |≤10 μm.

It should be noted that the second direction is the row direction in the example, while the second direction may also be the column direction in other embodiments, and may also be a direction of the display panel that forms an included angle of θ degrees with the row direction, where 0<θ<90°. In addition, in this embodiment, the second direction is the row direction, and the first direction is set to be a direction making an acute included angle with the row direction, which is merely an example of the present disclosure. It should be understood that the first direction may also be the row direction or the column direction, and at this time, the first direction and the second direction are parallel or perpendicular to each other.

With continued reference to FIGS. 19 and 20, the non-display region 12 further includes a first offset marker B1 and a second offset marker B2; the first offset mark A1 and the first offset mark B1 are disposed in the second direction 2, $\vec{p1}$ denotes a vector connecting a center of the first offset mark A1 and a center of the first offset mark B1, the vector $\vec{p1}$ satisfies: $\vec{p1}$ =n1× $\vec{c1}$, n1 is an integer greater than or equal to 1, $\vec{t2}$ denotes a second preset deviation, and | $\vec{t2}$ |≤10 μm. The second offset mark A2 and the second offset mark B2 are disposed in the second direction 2, $\vec{p2}$ denotes a vector connecting a center of the second offset mark A2 and a center of the second offset mark B2, the vector $\vec{p2}$ satisfies: $\vec{p2}$ =n2× $\vec{c1}$ + $\vec{t3}$, n2 is an integer greater than or equal to 1, $\vec{t3}$ denotes a third preset deviation, and | $\vec{t3}$ |≤10 μm.

For the first sub-pixel or the second sub-pixel, when the compensation layer and the light-emitting layer in the first sub-pixel or the second sub-pixel are prepared, a same evaporation mask may be respectively prepared and formed in two evaporation processes in the embodiments of the present disclosure, and the evaporation mask needs to be shifted according to an arrangement period of the sub-pixel minimum repeating units between the two evaporation processes, and the sub-pixel openings of the shifted evaporation masks may still be aligned to a pixel definition structure on the array substrate.

Figure 21:
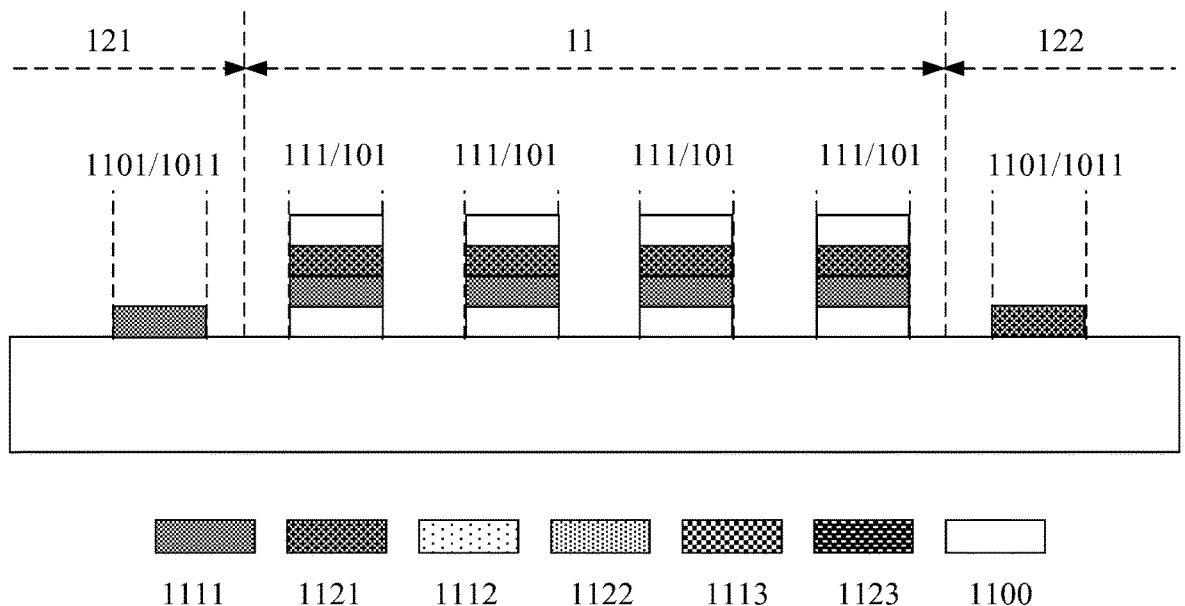
FIG. 21 is a cross-sectional view of the display panel shown in FIG. 20 along DD'.
Figure 22:
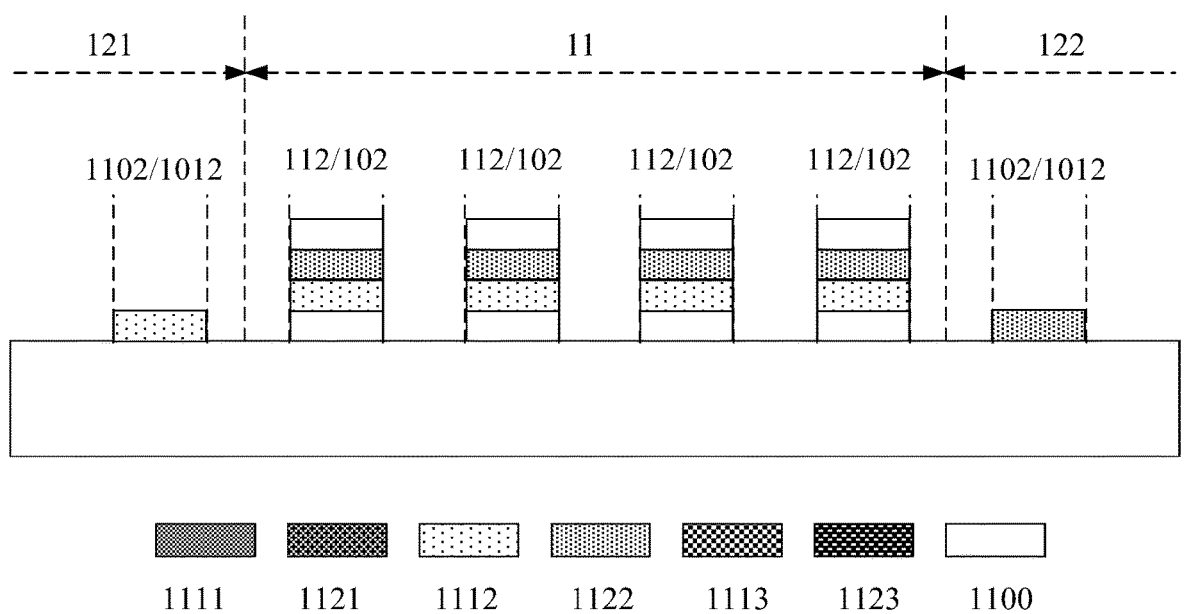
FIG. 22 is a cross-sectional view of the display panel shown in FIG. 20 along EE'.

FIG. 21 is a cross-sectional view of the display panel shown in FIG. 20 along DD', and FIG. 22 is a cross-sectional view of the display panel shown in FIG. 20 along EE'. With reference to FIGS. 20 to 22, in the embodiments of the present disclosure, continuing to use the second direction being the row direction as an example, the non-display region 12 of the display panel may include a first non-display region 121 and a second non-display region 122, the first non-display region 121 and the second non-display region 122 are disposed on two opposite sides of the display region 11 in the second direction 2; each of the first non-display region 121 and the second non-display region 122 includes a group of first virtual sub-pixel minimum repeating units 1011, and the first virtual sub-pixel minimum repeating unit 1011 include at least one first virtual sub-pixel 1101; the group of first virtual sub-pixel minimum repeating units 1011 are sequentially disposed in a direction perpendicular to the second direction 2, and a shape and a size of a first virtual sub-pixel 1101 in the group of first virtual sub-pixel minimum repeating units 1011 are completely the same as a shape and a size of a first sub-pixel 111 in the multiple first sub-pixel minimum repeating units 1011.

Each of the first non-display region 121 and the second non-display region 122 include a group of second virtual sub-pixel minimum repeating units 1012, the second virtual sub-pixel minimum repeating unit 1012 includes at least one second virtual sub-pixel 1102; the group of second virtual sub-pixel minimum repeating units 1012 are sequentially disposed in the direction perpendicular to the second direction 2, and a shape and a size of a second virtual sub-pixel 1102 in the group of second virtual sub-pixel minimum repeating units 1012 are completely the same as a shape and a size of a second sub-pixel 112 in the multiple second sub-pixel minimum repeating units 1012.

The first sub-pixel 111 in the first sub-pixel minimum repetition units 1012 includes a first compensation layer 1111 and a first light-emitting layer 1121 which are disposed in a laminated manner; and the second sub-pixel 112 in the second sub-pixel minimum repetition units 1012 includes a second compensation layer 1112 and a second light-emitting layer 1122 disposed in a stacked manner.

A first virtual sub-pixel 1101 in a first virtual sub-pixel minimum repetition unit 1011 disposed in the first non-display region 121 includes the first compensation layer 1111 and does not include the first light-emitting layer 1121; and a first virtual sub-pixel 1101 in a first virtual sub-pixel minimum repetition unit 1011 disposed in the second non-display region 122 includes the first light-emitting layer 1121 and does not include the first compensation layer 1111.

A second virtual sub-pixel 1102 in a second virtual sub-pixel minimal repeating unit 1012 disposed in the first non-display region 121 includes the second compensation layer 1112 and does not include the second light-emitting layer 1122; and a second virtual sub-pixel 1102 in a second virtual sub-pixel minimal repeating unit 1012 disposed in the second non-display region 122 includes the second light-emitting layer 1122 and does not include the second compensation layer 1112.

Figure 23:
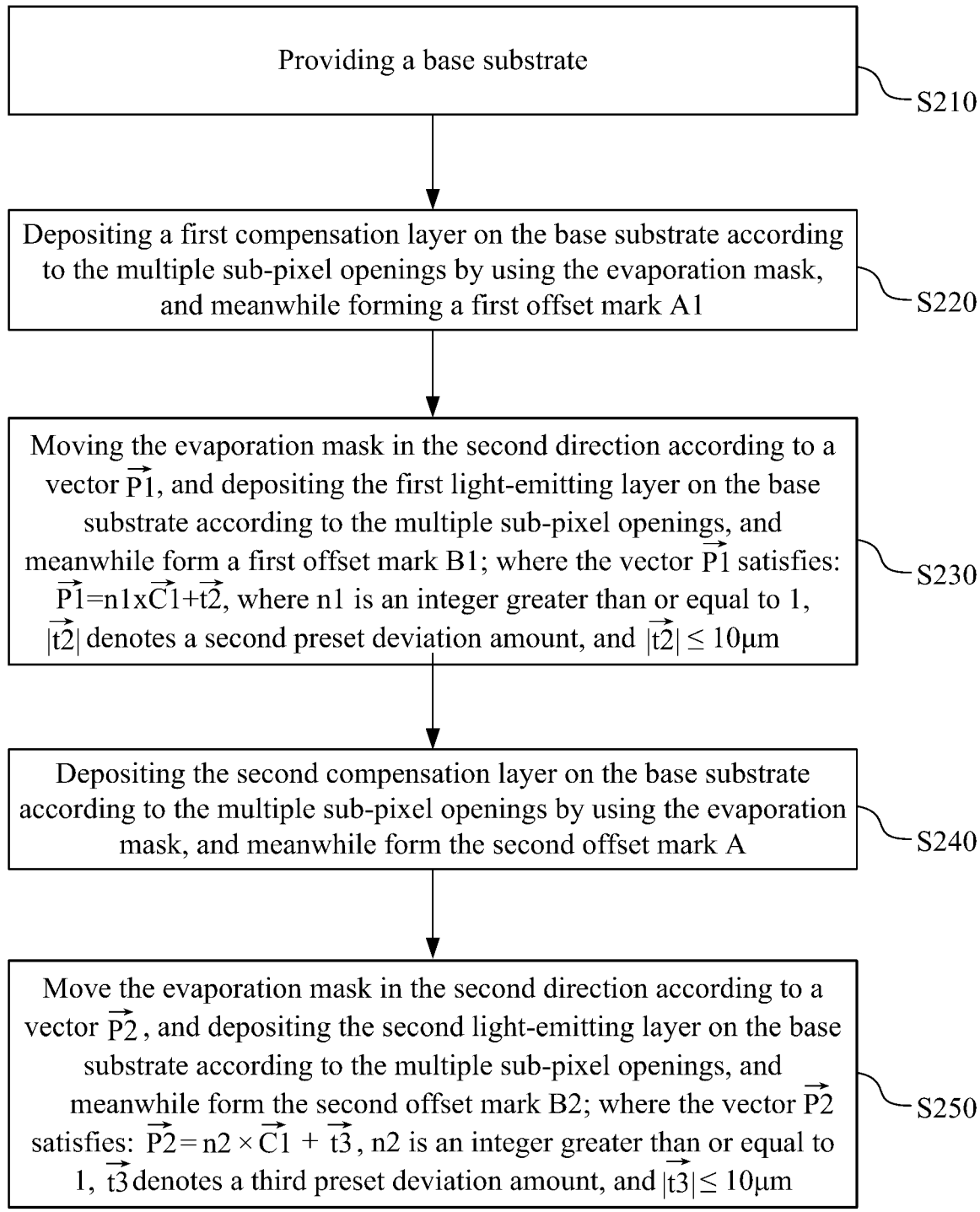
FIG. 23 is a flowchart of the preparation method of the display panel shown in FIG. 20.

Correspondingly, an embodiment of the present disclosure further provides a preparation method, FIG. 23 is a flowchart of the preparation method of the display panel shown in FIG. 20, FIGS. 24 to 27 are cross-sectional views showing various steps of the preparation method of the display panel shown in FIG. 23. With reference to FIGS. 20 to 27, the preparation method of the display panel includes described below.

In S210, a base substrate is provided.

S220, a first compensation layer is deposited on the base substrate according to the multiple sub-pixel openings by using the evaporation mask, and meanwhile a first offset mark A1 is formed.

Figure 24:
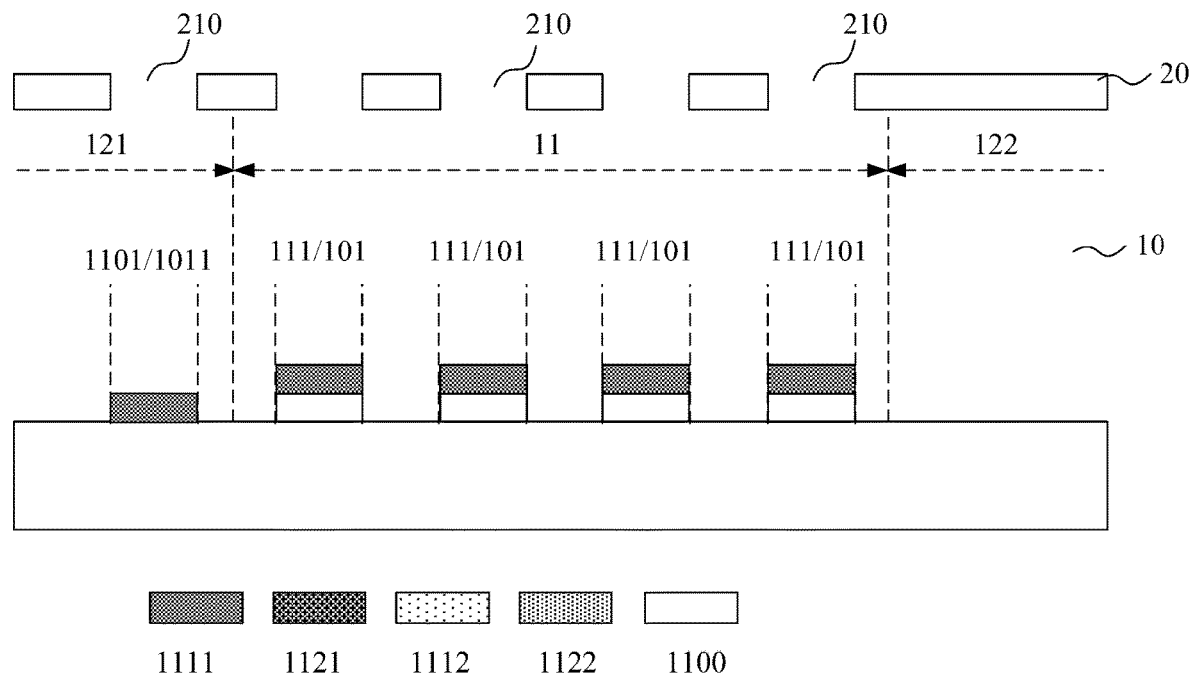
FIGS. 24 to 27 are cross-sectional views showing various steps of the preparation method of the display panel shown in FIG. 23.

With reference to FIG. 20, FIG. 21, and FIG. 24, in this step, the evaporation mask is disposed at a first alignment position, the sub-pixel opening 210 is aligned with the pixel definition unit of the first sub-pixel 111, and the offset mark opening 220 of the evaporation mask forms a first offset mark A1 in the non-display region 12 of the display panel while the first compensation layer 1111 is deposited according to the sub-pixel opening 210. Furthermore, it should be noted that the sub-pixel opening 210 in the evaporation mask not only forms the first compensation layer 1111 of the first sub-pixel 111 in the display region 11, but also forms the first virtual sub-pixel 1101 in the non-display region 12, the first virtual sub-pixel 1101 includes only the first compensation layer 1111.

In S230, the evaporation mask is moved in the second direction according to a vector $\vec{p_1}$, and the first light-emitting layer is deposited on the base substrate according to the multiple sub-pixel openings, and meanwhile a first offset mark B1 is formed; where the vector $\vec{p_1}$ satisfies: $\vec{p_1} = n_1 \times \vec{c_1} + \vec{t_2}$, where n1 is an integer greater than or equal to 1, $\vec{t_2}$ denotes a second preset deviation, and $|\vec{t_2}| \leq 10$ μm.

Figure 25:
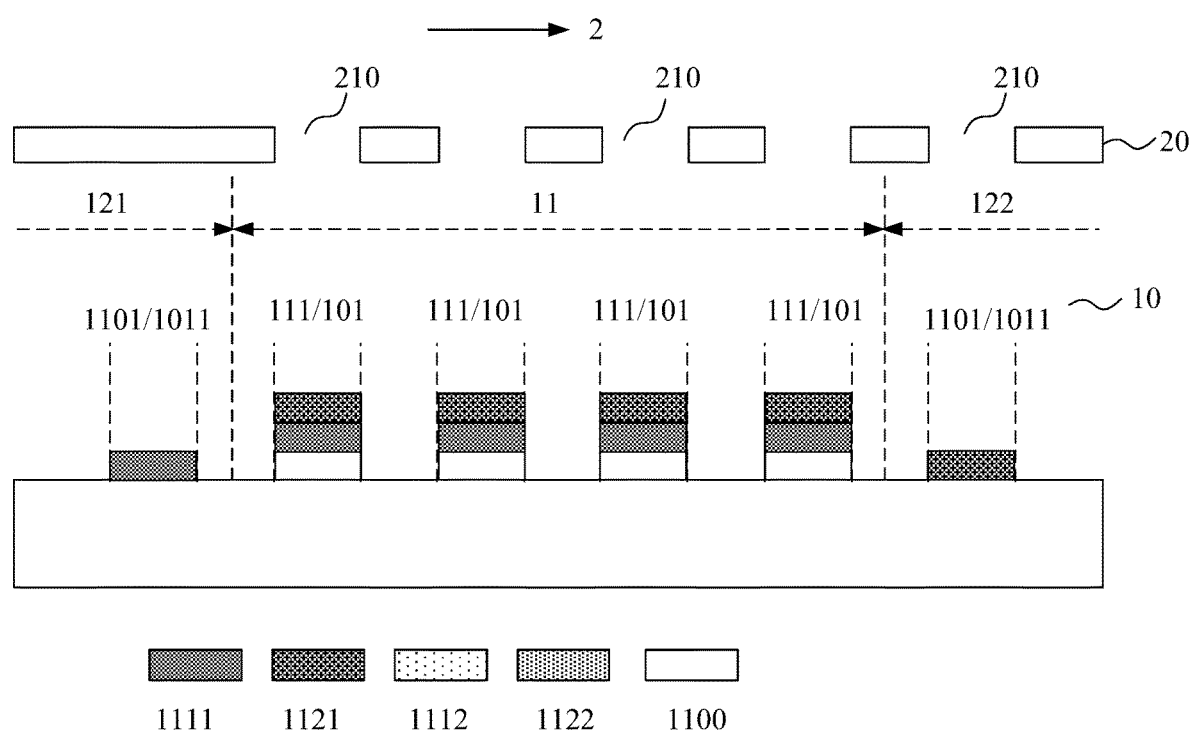

With reference to FIG. 20, FIG. 21 and FIG. 25, in the step, the evaporation mask is disposed at a second alignment position, the sub-pixel opening 210 is still aligned with the pixel definition unit of the first sub-pixel 111 after being shifted, while the first light-emitting layer 1121 is deposited according to the sub-pixel opening 210, the offset mark opening 220 of the evaporation mask forms the first offset mark B1 in the non-display region 12 of the display panel. It should be understood that the first offset mark B1 and the first offset mark A1 are disposed at different positions of the non-display region 12, and offsets of the first compensation layer 1111 and the first light-emitting layer 1121 may be measured, respectively. Furthermore, it should be noted that the sub-pixel opening 210 in the evaporation mask not only forms the first compensation layer 1111 of the first sub-pixel 111 in the display region 11, but also forms the first virtual sub-pixel 1101 in the non-display region 12, and the first virtual sub-pixel 1101 includes only the first light-emitting layer 1121.

Since the evaporation mask is shifted to the right in the row direction in this step, the first virtual sub-pixel 1101 in the step S220 is disposed in the first non-display region 121 on the left side of the display region 11, and the first virtual sub-pixel 1101 in the step S230 is disposed in the second non-display region 122 on the right side of the display region 11.

In S240, the second compensation layer is deposited on the base substrate according to the multiple sub-pixel openings by using the evaporation mask, and meanwhile the second offset mark A is formed.

Figure 26:
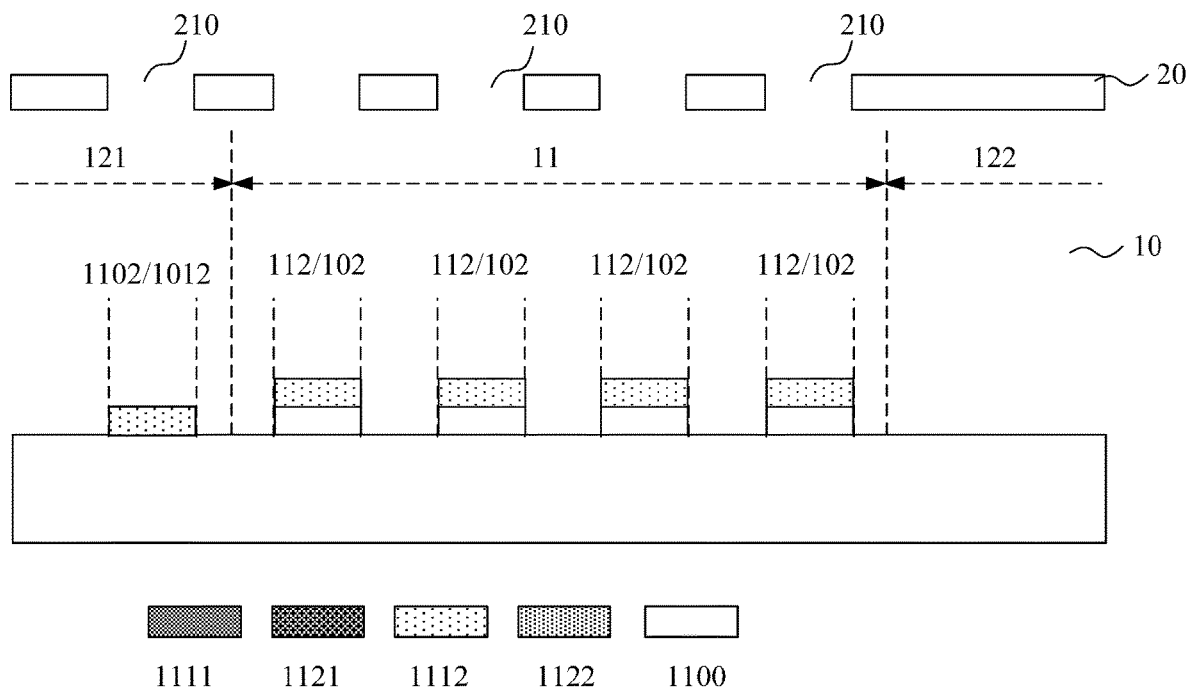

With reference to FIGS. 20, 22 and 26, likewise, in this step, the evaporation mask is disposed at a third alignment position, where the sub-pixel opening 210 is aligned with a pixel defining unit of the second sub-pixel 112, and the second offset mark a2 is formed in the non-display region 12 of the display panel by the offset mark opening 220 of the evaporation mask while the second compensation layer 1112 is deposited according to the sub-pixel opening 210. Furthermore, it should be noted that the sub-pixel openings 210 in the evaporation mask not only form the second compensation layer 1112 of the second sub-pixel 112 in the display region 11, but also form the second virtual sub-pixels 1102 in the non-display region 12, and the second virtual sub-pixels 1102 include only the second compensation layer 1112.

In S250, the evaporation mask is moved in the second direction according to a vector $\vec{p_2}$, and the second light-emitting layer is deposited on the base substrate according to the multiple sub-pixel openings, and meanwhile the second offset mark B2 is formed; where the vector $\vec{p_2}$ satisfies: $\vec{p_2} = n_2 \times \vec{c_1} + \vec{t_3}$, n2 is an integer greater than or equal to 1, $\vec{t_3}$ denotes a third preset deviation, and $|\vec{t_3}| \leq 10$ μm.

Figure 27:
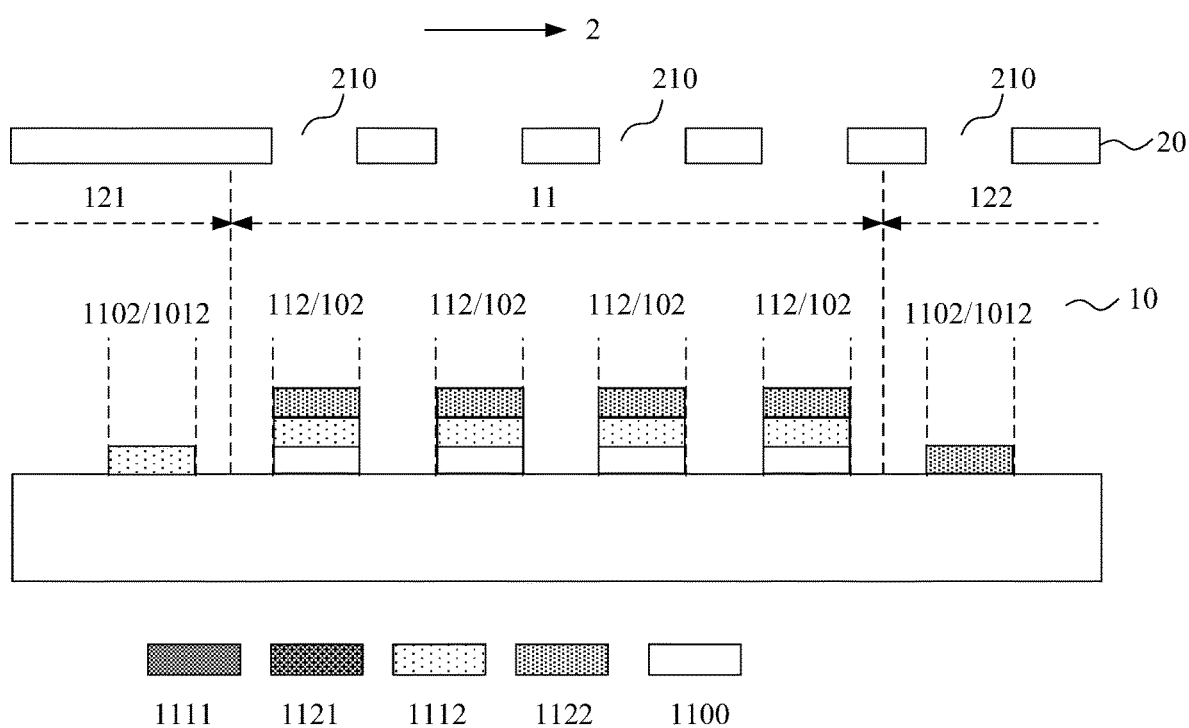

With reference to FIG. 20, FIG. 22, and FIG. 27, in this step, the evaporation mask is disposed at a fourth alignment position, the sub-pixel opening 210 is shifted and still aligned with the pixel definition unit of the second sub-pixel 112, and the offset mark opening 220 of the evaporation mask forms a second offset mark B2 in the non-display region 12 of the display panel while the second light-emitting layer 1122 is deposited according to the sub-pixel opening 210. It should be understood that the second offset mark B2 and the second offset mark A2 are disposed at different locations in the non-display region 12, and offsets of the second compensation layer 1112 and the second light-emitting layer 1122 may be measured, respectively. Furthermore, it should be noted that the sub-pixel opening 210 in the evaporation mask not only forms the second compensation layer 1112 of the second sub-pixel 112 in the display region 11, but also forms the second virtual sub-pixel 1102 in the non-display region 12, and the second virtual sub-pixel 1102 including only the second light-emitting layer 1122.

Since the evaporation mask is shifted to the right in the row direction in this step, the second virtual sub-pixel 1102 in the step S240 is disposed in the first non-display region 121 on the left side of the display region 11, and the second virtual sub-pixel 1102 in the step S250 is disposed in the second non-display region 122 on the right side of the display region 11.

In conclusion, it should be understood that the display panel may sequentially form the first offset mark A1, the first offset mark B1, the second offset mark A2 and the second offset mark B2 in the above four steps S220 to S250, the positions of the four offset marks are different, and therefore the four offset marks may be used for measuring the offset conditions of the corresponding organic film layers, respectively. Moreover, a same evaporation mask is adopted in the four steps to prepare the first sub-pixels and the second sub-pixels, so that the number of the evaporation masks is greatly reduced, and the cost of the display panel in the evaporation stage is saved.

The relative positions of the four offset marks shown in the drawings are only examples, and the relative positions of the first offset mark A1 and the first offset mark B1 depend on an arrangement direction of the first sub-pixel minimum repeating unit; the relative position of the second offset mark A2 and the second offset mark B2 depends on an arrangement direction of the second sub-pixel minimum repeating unit; the relative position of the first offset mark A1 and the second offset mark A2 depends on the staggered condition of consistent portions in the pattern composed of the first sub-pixels and the pattern composed of the second sub-pixels. Therefore, the positions of the four offset marks may be reasonably obtained by those skilled in the art according to the arrangement mode of the sub-pixels in the display region, which are not further illustrated herein.

As can be seen from the above-described preparation process, in the display panel of this embodiment, the first offset mark A1, the first compensation layer of the first virtual sub-pixel minimum repeating unit 1011 disposed in the first non-display region 121 and a first compensation layer 1111 of a first sub-pixel minimum repeating unit 101 disposed in the display region 11 are prepared and formed by adopting a same evaporation mask in a same evaporation process.

The first offset mark B1, the first light-emitting layer 1121 of the first virtual sub-pixel minimum repeating unit 1011 disposed in the second non-display region 122 and a first light-emitting layer 1121 of a first sub-pixel minimum repeating unit 101 disposed in the display region 11 are prepared and formed by adopting a same evaporation mask in a same evaporation process.

The first offset mark A1, the first compensation layer 1111 of the first virtual sub-pixel minimum repeating unit 1011 disposed in the first non-display region 121 and the first compensation layer 1111 of the first sub-pixel minimum repeating unit 101 disposed in the display region 11, as well as the first offset mark B1, the first light-emitting layer 1121 of the first virtual sub-pixel minimum repeating unit 1011 disposed in the second non-display region 122 and the first light-emitting layer 1121 of the first sub-pixel minimum repeating unit 101 disposed in the display region 11 are prepared and formed by adopting a same evaporation mask in different evaporation processes.

The second offset mark A2, the second compensation layer 1112 of the second virtual sub-pixel minimum repeating unit 1012 disposed in the first non-display region 121 and a second compensation layer 1112 of a second sub-pixel minimum repeating unit 102 disposed in the display region 11 are prepared and formed by adopting a same evaporation mask in a same evaporation process.

The second offset mark B2, the second light-emitting layer 1122 of the second virtual sub-pixel minimum repeating unit 1012 disposed in the second non-display region 122 and a second light-emitting layer 1122 of a second sub-pixel minimum repeating unit 102 disposed in the display region 11 are prepared and formed by adopting a same evaporation mask in a same evaporation process.

The second offset mark A2, the second compensation layer 1112 of the second virtual sub-pixel minimum repeating unit 1012 disposed in the first non-display region 121 and the second compensation layer 1112 of the second sub-pixel minimum repeating unit 102 disposed in the display region 11, as well as the second offset mark B2, the second light-emitting layer 1122 of the second virtual sub-pixel minimum repeating unit 1012 disposed in the second non-display region 122 and the second light-emitting layer 1122 of the second sub-pixel minimum repeating unit 102 disposed in the display region 11 are prepared and formed by adopting a same evaporation mask in different evaporation processes.

Likewise, based on a fact that an existing display panel is usually composed of at least three sub-pixels including a red sub-pixel, a green sub-pixel and a blue sub-pixel, therefore, in the display panel of the embodiments of the present disclosure, the display region of the display panel may be disposed to include the third sub-pixel. Further, the display region may further include multiple first sub-pixel minimum repeating units and/or multiple third sub-pixel minimum repeating units, the first sub-pixel minimum repeating units include at least one first sub-pixel, and the third sub-pixel minimum repeating units include at least one third sub-pixel; the multiple first sub-pixel minimum repeating units are sequentially and periodically disposed in the second direction, and in the second direction, $\vec{c1}$ denotes a vector connecting centers of any two adjacent first sub-pixel minimum repeating units; the multiple third sub-pixel minimum repeating units are sequentially and periodically disposed in the second direction, and in the second direction, $\vec{c2}$ denotes a vector connecting centers of any two adjacent third sub-pixel minimum repeating units.

The non-display region further includes multiple first virtual sub-pixels and multiple third virtual sub-pixels, the pattern composed of the first sub-pixels and the first virtual sub-pixels is completely consistent with the pattern composed of the third sub-pixels and the third virtual sub-pixels and is staggered in the fifth direction, and a staggered vector is $\vec{h2}$. Where the staggered vector $\vec{d2}$ satisfies: $\vec{d2}$ =m2× $\vec{c1}$ + $\vec{h2}$, and m2 is an integer greater than or equal to 0.

The same as in the above-described embodiments in which the display region of the display panel includes the second sub-pixels and the second sub-pixels may form the second sub-pixel minimum repetition units, under the premise that the first sub-pixels may form the first sub-pixel minimum repetition units and the third sub-pixels may form the third sub-pixel minimum repetition units, in the embodiments of the present disclosure, the first compensation layer and the first light-emitting layer of the first sub-pixel may be respectively prepared in two evaporation processes by adopting a same evaporation mask, and the third compensation layer and the third light-emitting layer of the third sub-pixel may be respectively prepared in the other two evaporation processes by adopting the evaporation mask. It should be understood that when the first compensation layer and the first light-emitting layer of the first sub-pixel are prepared, an evaporation mask needs to be shifted, when the first compensation layer is formed, the first virtual sub-pixel minimum repeating unit is synchronously formed in the non-display region, and the first virtual sub-pixel minimum repeating unit is composed of the first compensation layer; when the first light-emitting layer is formed, the first virtual sub-pixel minimum repeating unit is synchronously formed in the non-display region, and the first virtual sub-pixel minimum repeating unit is composed of the first light-emitting layer. Similarly, when the third compensation layer and the third light-emitting layer of the third sub-pixel are prepared, the evaporation mask needs to be shifted, the third virtual sub-pixel minimum repeating unit is synchronously formed in the non-display region when the third compensation layer is formed, and the third virtual sub-pixel minimum repeating unit is composed of the third compensation layer; and when the third light-emitting layer is formed, the third virtual sub-pixel minimum repeating unit is synchronously formed in the non-display region, and the third virtual sub-pixel minimum repeating unit is composed of the third light-emitting layer.

Further, the non-display region further includes the first offset mark B1 and the third offset mark B3. The first offset mark A1 and the first offset mark B1 are disposed along the second direction, $\vec{p1}$ denotes a vector connecting the center of the first offset mark A1 and the center of the first offset mark B1, the vector $\vec{p1}$ satisfies: $\vec{p1} = n1 \times \vec{c1} + \vec{t2}$, n1 is an integer greater than or equal to 1, $\vec{t2}$ denotes a second preset deviation, and $\vec{t2} \leq 10$ µm; the third offset mark A3 and the third offset mark B3 are disposed in the second direction, $\vec{p3}$ denotes a vector connecting the center of the third offset mark A3 and the center of the third offset mark B3, the vector $\vec{p3}$ satisfies: $\vec{p3} = n3 \times \vec{c1} + \vec{t5}$, n3 is an integer greater than or equal to 1, $\vec{t5}$ denotes a fifth preset deviation, and $\vec{t5} \leq 10$ µm.

It should be understood that the offset mark opening of the evaporation mask forms a first offset mark A1 in the non-display region when the first compensation layer is prepared, forms a first offset mark B1 in the non-display region when the first light-emitting layer is prepared, and forms a third offset mark A3 in the non-display region when the third compensation layer is prepared, and a third offset mark B3 is formed in the non-display region when the third light-emitting layer is prepared. A relative position of the first offset mark A1 and the first offset mark B1 depends on a displacement vector of the evaporation mask when the first compensation layer and the first light-emitting layer are prepared, and a relative position of the third offset mark A3 and the third offset mark B3 depends on a displacement vector of the evaporation mask when the third compensation layer and the third light-emitting layer are prepared. Moreover, due to a fact that a process error exist during displacement of the evaporation mask, a vector connecting a center of the first offset mark A1 and a center of the first offset mark B1 should be a sum of a period of a corresponding sub-pixel minimum repeating unit and the process error. A vector connecting a center of the third offset mark A3 and a center of the third offset mark B3 should be a sum of a period of a corresponding sub-pixel minimum repeating unit and the process error. The process error described above should include a direction error and a distance error, i.e., a preset deviation $\vec{t2}$ and $\vec{t5}$.

Figure 28:
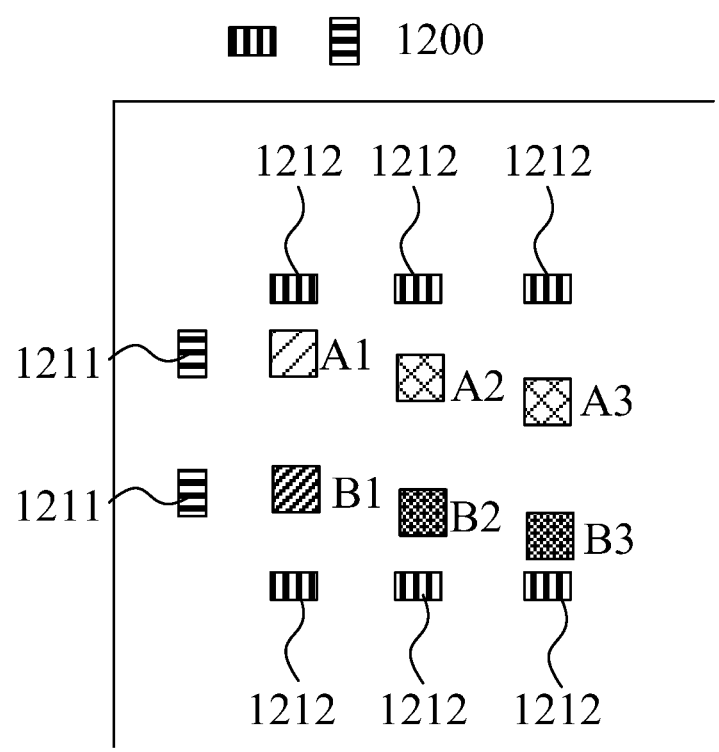
FIG. 28 is a partial structural diagram of another display panel provided in an embodiment of the present disclosure.

In the embodiments of the present disclosure, the offset mark is mainly used for the offset measurement, and since the offset mark is relatively small, a graphic size of the offset mark is equivalent to a graphic size of the sub-pixel minimum repeating unit. Therefore, a position of the offset mark needs to be determined in the display panel before the offset measurement is made. FIG. 28 is a partial structural diagram of another display panel provided in an embodiment of the present disclosure, and with reference to FIG. 28, on the basis of the display panel provided in the above embodiment, it may also be provided that the non-display region may further include multiple alignment marks 1200 for determining a position of the offset mark. The alignment mark 1200 is a mark pattern synchronously formed when film layers such as a metal layer are prepared on the base substrate. The mark pattern is a mark with a special pattern, when an image acquisition unit finds the offset mark, the position of the offset mark may be quickly determined through the mark pattern with the special pattern, and then the offset is measured.

Specifically, it may be provided that the multiple alignment marks include multiple strip-shaped marks, each of the strip-shaped marks includes a first strip-shaped mark 1211 and a second strip-shaped mark 1212; a line connecting a center of at least one first strip-shaped mark 1211 and the center of the first offset mark A1 or the center of the second offset mark A2 is parallel to the row direction, a line connecting a center of the at least one second strip-shaped mark 1212 and the center of the first offset mark A1 is perpendicular to the row direction, and a line connecting a center of at least one second strip-shaped mark 1212 and the center of the second offset mark A2 is perpendicular to the row direction.

The first strip-shaped mark 1211 is used for determining a position of the first offset mark A1 or the second offset mark A2 on the display panel in the column direction, and the second strip-shaped mark 1212 is used for determining a position of the first offset mark A1 and the second offset mark A2 on the display panel in the row direction, and at this time, a position of the first offset mark A1 or the second offset mark A2 on the display panel is determined through the at least three strip-shaped marks.

It should be noted that in the display panel shown in FIG. 28, the strip-shaped mark may be shared when the positions where the offset marks are provided are adjacent to each other. Since the first offset mark A1, the second offset mark A2 and the third offset mark A3 are disposed in the row direction, the positions of rows where the first offset mark A1, the second offset mark A2 and the third offset mark A3 are disposed may be determined in an auxiliary manner by providing one strip-shaped mark. Similarly, for the first offset mark B1, the second offset mark B2 and the third offset mark B3, a strip-shaped mark may also be provided to assist in determining the positions of the rows where the first offset mark A1, the second offset mark A2 and the third offset mark A3 are disposed. Since the first offset mark A1 and the first offset mark B1 are disposed in the row direction, one strip-shaped mark may be provided to assist in determining the positions of columns where the two offset marks are disposed. The same is true for the second offset marks A2 and B2 and the third offset marks A3 and B3, which are not repeated here.

Figure 29:
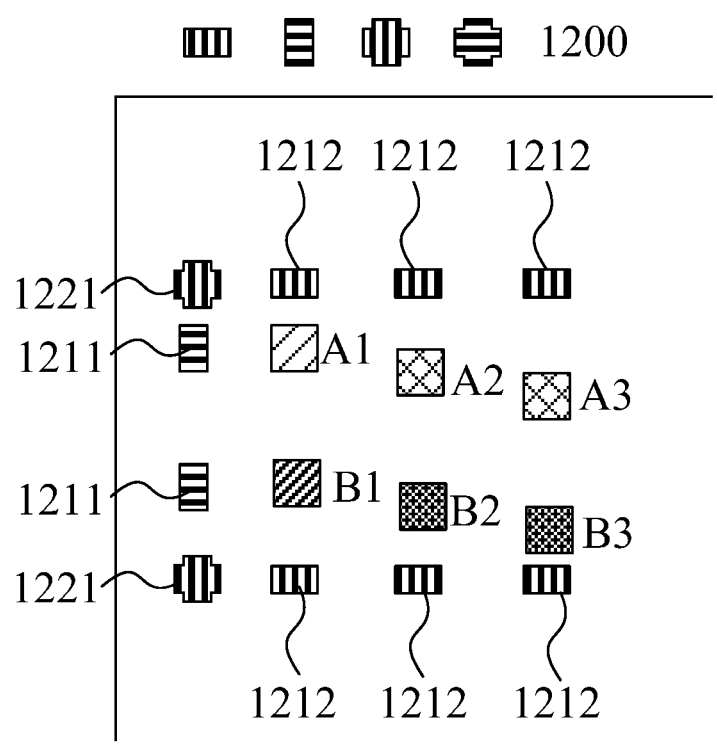
FIG. 29 is s a partial structural diagram of another display panel provided in an embodiment of the present disclosure.

Further, in another embodiment of the present disclosure, it may also be provided that the alignment mark includes a cross-shaped mark. FIG. 29 is s a partial structural diagram of another display panel provided in an embodiment of the present disclosure, and with reference to FIG. 29, on the basis of the display panel described above, it may also be provided that multiple alignment marks 1200 may further include a cross-shaped mark 1221; a line connecting a center of at least one cross-shaped marking 1221 and a center of one first strip-shaped marking 1211 is parallel to the row direction, and a line connecting a center of at least one cross-shaped marking 1221 and a center of one second strip-shaped marking 1212 is perpendicular to the row direction.

It should be understood that compared with the strip-shaped mark, the pattern of the cross-shaped mark is more special, and the position of the offset mark may be rapidly determined from the image by using the cross-shaped mark before an offset test is performed, so that a search speed of the offset mark may be accelerated, and the efficiency of the offset test is improved.

Figure 30:
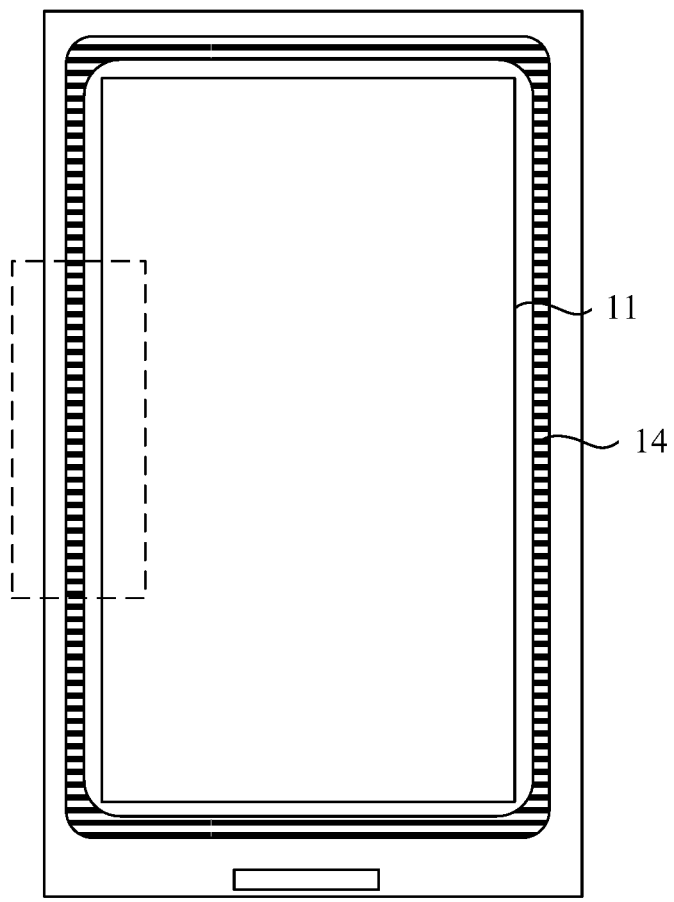
FIG. 30 is a structural diagram of another display panel provided in an embodiment of the present disclosure.
Figure 31:
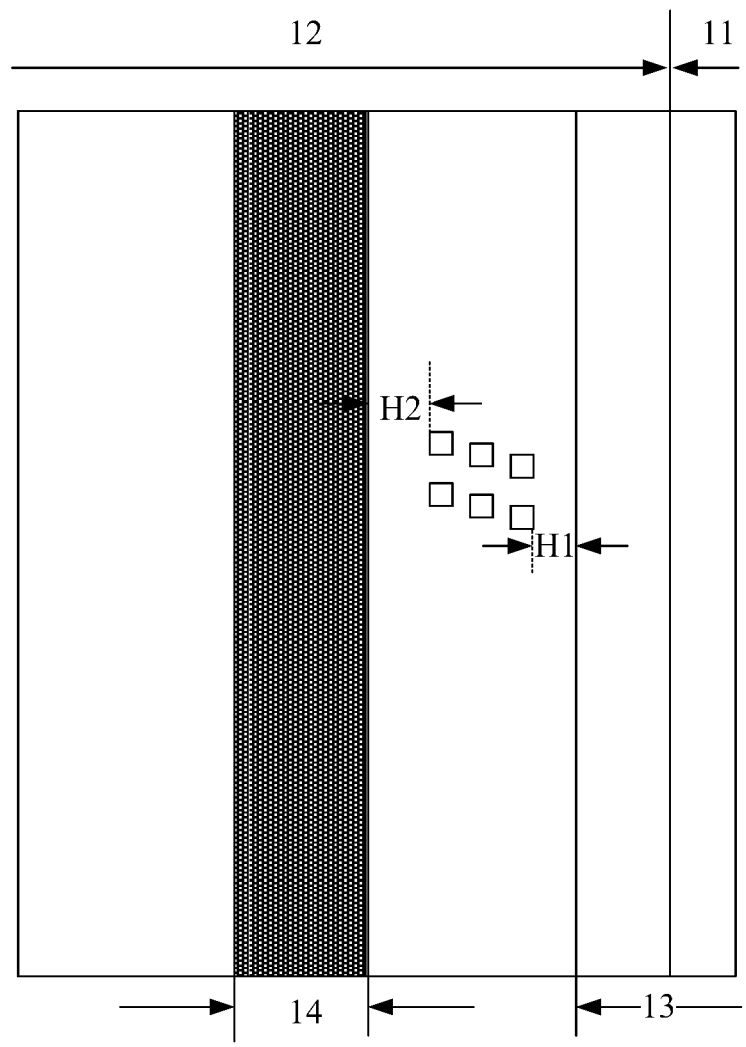
FIG. 31 is an enlarged view showing partial structures of the display panel shown in FIG. 30 along a dotted line frame.

FIG. 30 is a structural diagram of another display panel provided in an embodiment of the present disclosure, and FIG. 31 is an enlarged view showing partial structures of the display panel shown in FIG. 30 along a dotted line frame, with reference to FIGS. 30 and 31, the display panel 10 further includes a common organic layer coverage region 13, and the common organic layer coverage region 13 covers the display region 11 and a part of the non-display region 12. In the embodiments of the present disclosure, a distance H1 between the shift mark closest to the common organic layer coverage region 13 and the common organic layer coverage region 13 may be set to be greater than or equal to 20 μm.

The common organic layer coverage region 13 means that the display panel forms a common organic film layer when preparing each sub-pixel. The display panel shown in FIG. 1 is used as an example, the buffer layer, the hole injection layer, the hole transport layer, the hole blocking layer, the electron transport layer, and the like are all common organic film layers, and such film layers are generally masked by a large-window evaporation mask to form a covering layer on the display panel so as to cover all minimum repeating units of the sub-pixels. Thus, it should be understood that a common organic footprint 13 is now formed on the display panel. The inventor finds that, a distance between the offset mark closest to the common organic layer coverage region 13 and the common organic layer coverage region 13 is set to be not less than 20 μm, even if the evaporation mask is offset to a certain degree, the offset measurement of the offset mark may be prevented from being influenced by the overlapping of the organic film layer in the common organic layer coverage region 13 and the offset mark, and meanwhile the influence of the offset mark on the performance of the organic film layer may be prevented.

With continued reference to FIGS. 30 and 31, the display panel 10 further includes a glass paste packaging region 14, and the glass paste packaging region 14 surrounds the display region 11. In the embodiments of the present disclosure, it may also be provided that a distance H2 between the offset mark closest to the glass paste packaging region 14 and the glass paste packaging region 14 may be greater than or equal to 50 μm.

For an OLED display panel, an organic material in an OLED unit of the OLED display panel is easily eroded by water and oxygen, and in order to avoid water and oxygen invasion, a glass paste and a glass cover plate are usually adopted to package the OLED unit so as to form a closed space. The glass paste packaging region 14 in this embodiment essentially refers to a region to which the glass paste adheres, and the glass paste packaging region 14 surrounds the display region 11. Based on this, the inventor also finds that a distance between the deviation mark closest to the glass paste packaging region 14 and the glass paste packaging region 14 is set to be larger than or equal to 50 μm, it may be guaranteed that even if the evaporation mask offsets or the glass paste offsets, the glass paste packaging region 14 and the deviation mark may still be prevented from being overlapped, and thus the influence of the glass paste packaging region 14 on the offset measurement may be avoided.

An embodiment of the present disclosure further provides a display device including any one of the display panels of the above embodiments. Moreover, since the display panel adopts the array substrate described in each embodiment, the display panel provided in the embodiments of the present disclosure also has the same beneficial effects as the above array substrate. It should be noted that the display device further includes other devices for supporting a normal operation of the display device. The display device may be any product or component with a display function, such as a mobile phone, a tablet personal computer, a television, an electronic paper, and an electronic photo frame.

It should be noted that the above-mentioned contents are only the preferred embodiments of the present disclosure and the technical principles applied thereto. It should be understood by those skilled in the art that the present disclosure is not limited to the particular embodiments described herein, and that various obvious variations, rearrangements, mutual combinations and substitutions may be made without departing from the scope of protection of the present disclosure. Therefore, although the present disclosure has been described in detail with reference to the above embodiments, the present disclosure is not limited to the above embodiments, and may further include other equivalent embodiments without departing from the concept of the present disclosure, and the scope of the present disclosure is defined by the appended claims.

What is claimed is:

1. A display panel, comprising a display region and a non-display region located at a periphery of the display region; wherein, the display region comprises a plurality of first sub-pixels and a plurality of second sub-pixels, and the plurality of first sub-pixels and the plurality of second sub-pixels have a same shape and a same size and are different in color; an array of a pattern composed of the plurality of first sub-pixels is at least partially consistent with an array of a pattern composed of the plurality of second sub-pixels, and at least part patterns of mutually coincident patterns are staggered in a first direction, and $\vec{d1}$ denotes a staggered vector in the first direction; and the non-display region comprises a first offset mark A1 and a second offset mark A2, the first offset mark A1 and the second offset mark A2 are disposed in the first direction, $\vec{L1}$ denotes a vector connecting a center of the first offset mark A1 and a center of the second offset mark A2, and the vector $\vec{L1}$ satisfies: $\vec{L1}=\vec{d1}+\vec{t1}$;

wherein $\vec{t1}$ denotes a first preset deviation, and $|\vec{t1}| \leq 10$ μm;

wherein the non-display region comprises a plurality of first virtual sub-pixels and a plurality of second virtual sub-pixels, and the plurality of first virtual sub-pixels and the plurality of first sub-pixels are the same in shape, size and color, and the plurality of second virtual sub-pixels and the plurality of second sub-pixels are the same in shape, size and color;

and the plurality of first virtual sub-pixels and the plurality of second virtual sub-pixels are disposed around the display region;

wherein an array of a pattern composed of the plurality of first virtual sub-pixels and the plurality of first sub-pixels is at least partially consistent with an array of a pattern composed of the plurality of second virtual sub-pixels and the plurality of second sub-pixels, and mutually coincident patterns comprise the pattern composed of the plurality of first sub-pixels and the pattern composed of the plurality of second sub-pixels;

wherein each of the plurality of first sub-pixels comprises a first compensation layer, a first light-emitting layer, and electrode layers disposed on both sides of the first compensation layer and the first light-emitting layer in a light-emitting direction; each of the plurality of second sub-pixels comprise a second compensation layer, a second light-emitting layer, and electrode layers disposed on both sides of the second compensation layer and the second light-emitting layer in the light-emitting direction; and wherein each of the plurality of first virtual sub-pixels comprises at least one of a first compensation layer or a first light-emitting layer and does not comprise an electrode layer; and each of the plurality of second virtual sub-pixels comprises at least one of a second compensation layer or a second light-emitting layer and does not comprise an electrode layer.

2. The display panel of claim 1, wherein the first direction is a row direction of the display panel, a column direction of the display panel, or a direction of the display panel that forms an included angle of θ degrees with the row direction, wherein 0<θ<90°.

3. The display panel of claim 1, wherein the array of the pattern composed of the plurality of first sub-pixels is consistent with the array of the pattern composed of the plurality of second sub-pixels.

4. The display panel of claim 1, wherein the pattern composed of the plurality of first sub-pixels comprises a first pattern and a second pattern, the pattern composed of the plurality of second sub-pixels comprises a third pattern, and the first pattern is the same as the third pattern; in the first direction, the third pattern is staggered towards a first side of the first pattern relative to the first pattern; and the second pattern is disposed on the first side of the first pattern in the first direction.

5. The display panel of claim 4, the non-display region further comprises a plurality of second virtual sub-pixels; the plurality of second sub-pixels and the plurality of second virtual sub-pixels are the same in shape, size and color; and the plurality of second virtual sub-pixels are disposed on a first side of the second pattern in the first direction; and
the array of the pattern composed of the plurality of first sub-pixels is completely consistent with an array of the pattern composed of the plurality of second sub-pixels and the plurality of second virtual sub-pixels.

6. The display panel of claim 1, wherein the pattern composed of the plurality of first sub-pixels comprises a first pattern, the pattern composed of the plurality of second sub-pixels comprises a second pattern and a third pattern, and the first pattern and the third pattern are the same; and
wherein in the first direction, the third pattern is staggered towards a first side of the first pattern relative to the first pattern; the second pattern is disposed on a second side of the third pattern in the first direction, and the first side and the second side are facing away from each other in the first direction.

7. The display panel of claim 6, the plurality of first sub-pixels and the plurality of first virtual sub-pixels are the same in shape, size and color; and the plurality of first virtual sub-pixels are disposed on a second side of the second pattern in the first direction; and wherein the array of the pattern composed of the plurality of first virtual sub-pixels and the plurality of first sub-pixels is consistent with the array of the pattern composed of the plurality of second sub-pixels.

8. The display panel of claim 1, wherein the plurality of first sub-pixels and the first offset mark A1 are prepared and formed by adopting a first same evaporation mask in a first same evaporation process; and the plurality of second sub-pixels and the second offset mark A2 are prepared and formed by adopting a second same evaporation mask in a second same evaporation process; and
the plurality of first sub-pixels, the first offset mark A1, the plurality of second sub-pixels and the second offset mark A2 are prepared and formed by adopting a same evaporation mask in different evaporation processes.

9. The display panel of claim 1, wherein the display region comprises at least one of a plurality of first sub-pixel minimum repeating units or a plurality of second sub-pixel minimum repeating units, each of the plurality of first sub-pixel minimum repeating units comprises at least one first sub-pixel of the plurality of first sub-pixels, and each of the plurality of second sub-pixel minimum repeating units comprises at least one second sub-pixel of the plurality of second sub-pixels;

the plurality of first sub-pixel minimum repeating units are sequentially and periodically disposed in a second direction, and in the second direction, $\vec{C1}$ denotes a vector connecting centers of any two adjacent first sub-pixel minimum repeating units; the plurality of second sub-pixel minimum repeating units are sequentially and periodically disposed in the second direction, and in the second direction, $\vec{C2}$ denotes a vector connecting centers of any two adjacent second sub-pixel minimum repeating units, and $\vec{C1}$ and $\vec{C2}$ have a same direction and a same distance;

an array of a pattern composed of the plurality of first sub-pixels and the plurality of first virtual sub-pixels is completely consistent with an array of a pattern composed of the plurality of second sub-pixels and the plurality of second virtual sub-pixels, wherein the pattern composed of the plurality of second sub-pixels and the plurality of second virtual sub-pixels is staggered by a vector $\vec{h1}$, in a third direction, from the pattern composed of the plurality of first sub-pixels and the plurality of first virtual sub-pixels, the staggered vector $\vec{d1}$ satisfies: $\vec{d1}=m1\times\vec{C2}=\vec{h1}$, and m1 is an integer greater than or equal to 0.

10. The display panel of claim 9, wherein the non-display region further comprises a first offset mark B1 and a second offset mark B2;

the first offset mark A1 and the first offset mark B1 are disposed in the second direction, $\vec{P1}$ denotes a vector connecting a center of the first offset mark A1 and a center of the first offset mark B1, the vector $\vec{P1}$ satisfies: $\vec{P1}=n1\times\vec{C1}+\vec{t2}$, n1 is an integer greater than or equal to 1, $\vec{t2}$ denotes a second preset deviation, and $|\vec{t2}|\leq 10$ μm; and the second offset mark A2 and the second offset mark B2 are disposed in the second direction, $\vec{P2}$ denotes a vector connecting a center of the second offset mark A2 and a center of the second offset mark B2, the vector $\vec{P2}$ satisfies: $\vec{P2}=n2\times\vec{C1}+\vec{t3}$, n2 is an integer greater than or equal to 1, $\vec{t3}$ denotes a third preset deviation, and $|\vec{t3}|\leq 10$ μm.

11. The display panel of claim 10, wherein the second direction is a row direction of the display panel, a column direction of the display panel, or a direction of the display panel that forms an included angle of θ degrees with the row direction, wherein 0<θ<90°.

12. The display panel of claim 11, where the second direction is the row direction or the column direction of the display panel;
the non-display region comprises a first non-display region and a second non-display region, and the first non-display region and the second non-display region are disposed on two opposite sides of the display region in the second direction;
each of the first non-display region and the second non-display region comprises a group of first virtual sub-pixel minimum repeating units, and each first virtual sub-pixel minimum repeating unit of the group of first virtual sub-pixel minimum repeating units comprises at least one first virtual sub-pixel; the group of first virtual sub-pixel minimum repeating units are sequentially disposed in a direction perpendicular to the second direction, and a shape and a size of a first virtual sub-pixel in the group of first virtual sub-pixel minimum repeating units are completely the same as a shape and a size of a first sub-pixel in the plurality of first sub-pixel minimum repeating units;
each of the first non-display region and the second non-display region comprises a group of second virtual sub-pixel minimum repeating units, and each second virtual sub-pixel minimum repeating unit of the group of second virtual sub-pixel minimum repeating units comprises at least one second virtual sub-pixel; the group of second virtual sub-pixel minimum repeating units are sequentially disposed in the direction perpendicular to the second direction, and a shape and a size of a second virtual sub-pixel in the group of second virtual sub-pixel minimum repeating units are completely the same as a shape and a size of a second sub-pixel in the plurality of second sub-pixel minimum repeating units;
the first sub-pixel in the group of first sub-pixel minimum repeating units comprises a first compensation layer and a first light-emitting layer disposed in a laminated manner; and the second sub-pixel in the group of second sub-pixel minimum repeating units comprises a second compensation layer and a second light-emitting layer disposed in a laminated manner;
a first virtual sub-pixel in a first virtual sub-pixel minimum repeating unit disposed in the first non-display region comprises the first compensation layer and does not comprise the first light-emitting layer; and a first virtual sub-pixel in a first virtual sub-pixel minimum repeating unit disposed in the second non-display region comprises the first light-emitting layer and does not comprise the first compensation layer; and
a second virtual sub-pixel in a second virtual sub-pixel minimum repeating unit disposed in the first non-display region comprises the second compensation layer and does not comprise the second light-emitting layer; and a second virtual sub-pixel in a second virtual sub-pixel minimum repeating unit disposed in the second non-display region comprises the second light-emitting layer and does not comprise the second compensation layer.

13. The display panel of claim 12, wherein,
the first offset mark A1, the first compensation layer of the first virtual sub-pixel minimum repeating unit disposed in the first non-display region and a first compensation layer of a first sub-pixel minimum repeating unit disposed in the display region are prepared and formed by adopting a same evaporation mask in a same evaporation process;
the first offset mark B1, the first light-emitting layer of the first virtual sub-pixel minimum repeating unit disposed in the second non-display region and a first light-emitting layer of a first sub-pixel minimum repeating unit disposed in the display region are prepared and formed by adopting a same evaporation mask in a same evaporation process;
the first offset mark A1, the first compensation layer of the first virtual sub-pixel minimum repeating unit disposed in the first non-display region and the first compensation layer of the first sub-pixel minimum repeating unit disposed in the display region, as well as the first offset mark B1, the first light-emitting layer of the first virtual sub-pixel minimum repeating unit disposed in the second non-display region and the first light-emitting layer of the first sub-pixel minimum repeating unit disposed in the display region are prepared and formed by adopting a same evaporation mask in different evaporation processes;
the second offset mark A2, the second compensation layer of the second virtual sub-pixel minimum repeating unit disposed in the first non-display region and a second compensation layer of a second sub-pixel minimum repeating unit disposed in the display region are prepared and formed by adopting a same evaporation mask in a same evaporation process;
the second offset mark B2, the second light-emitting layer of the second virtual sub-pixel minimum repeating unit disposed in the second non-display region and a second light-emitting layer of a second sub-pixel minimum repeating unit disposed in the display region are prepared and formed by adopting a same evaporation mask in a same evaporation process; and
the second offset mark A2, the second compensation layer of the second virtual sub-pixel minimum repeating unit disposed in the first non-display region and the second compensation layer of the second sub-pixel minimum repeating unit disposed in the display region, as well as the second offset mark B2, the second light-emitting layer of the second virtual sub-pixel minimum repeating unit disposed in the second non-display region and the second light-emitting layer of the second sub-pixel minimum repeating unit disposed in the display region are prepared and formed by adopting a same evaporation mask in different evaporation processes.

14. The display panel of claim 11, in which the first direction and the second direction are parallel or perpendicular to each other.

15. The display panel of claim 1, wherein the display region further comprises a plurality of third sub-pixels, the plurality of third sub-pixels and the plurality of first sub-pixels are the same in shape and size, and the plurality of third sub-pixels have a different color than the plurality of first sub-pixels and the plurality of second sub-pixels; an array of a pattern composed of the plurality of third sub-pixels is at least partially consistent with the array of the pattern composed of the plurality of first sub-pixels, and at least part patterns of mutually coincident patterns are staggered in a fourth direction, and $\vec{d2}$ denotes a stagged vector in the fourth direction;

the non-display region further comprises a third offset mark A3; wherein the first offset mark A1 and the third offset mark A3 are disposed in the fourth direction, $\vec{L2}$ denotes a vector connecting a center of the first offset mark A1 and a center of the third offset mark A3, and the vector $\vec{L2}$ satisfies: $\vec{L2}=\vec{d2}+\vec{t4}$; wherein $\vec{t4}$ is a fourth preset deviation, and $|\vec{t4}|\leq 10$ μm.

16. The display panel of claim 15, wherein the first sub-pixel, the second sub-pixel, and the third sub-pixel are one of a red sub-pixel, a green sub-pixel, and a blue sub-pixel, respectively; and the first offset mark A1, the second offset mark A2 and the third offset mark A3 are one of a first red offset mark A1, a second green offset mark A2 and a third blue offset mark A3, respectively.

17. The display panel of claim 1, the non-display region further comprises a plurality of alignment marks for determining a position of the at least one of the first offset mark A1 and the second offset mark A2.

18. The display panel of claim 17, wherein the plurality of alignment marks comprises a plurality of strip-shaped marks, the plurality of strip-shaped marks comprises a plurality of first strip-shaped marks and a plurality of second strip-shaped marks; and a line connecting a center of at least one of the plurality of first strip-shaped marks and the center of the first offset mark A1 or the center of the second offset mark A2 is parallel to a row direction, and a line connecting a center of at least one second first strip-shaped mark of the plurality of second strip-shaped marks and the center of the first offset mark A1 is perpendicular to the row direction; and a line connecting the center of the at least one second strip-shaped mark and the center of the second offset mark A2 is perpendicular to the row direction.

19. The display panel of claim 18, wherein the plurality of alignment marks further comprise cross-shaped marks; and a line connecting a center of at least one cross-shaped mark of the cross-shaped marks and a center of one of the plurality of first strip-shaped marks is parallel to the row direction, and a line connecting the center of the at least one cross-shaped mark and a center of one of the plurality of second strip-shaped marks is perpendicular to the row direction.

20. An evaporation mask, wherein the evaporation mask is used for forming a display panel through the evaporation mask;

wherein the display panel comprises: a display region and a non-display region located at a periphery of the display region; wherein, the display region comprises a plurality of first sub-pixels and a plurality of second sub-pixels, and the plurality of first sub-pixels and the plurality of second sub-pixels have a same shape and a same size and are different in color; an array of a pattern composed of the plurality of first sub-pixels is at least partially consistent with an array of a pattern composed of the plurality of second sub-pixels, and at least part patterns of mutually coincident patterns are staggered in a first direction, and $\vec{d1}$ denotes a staggered vector in the first direction; and the non-display region comprises a first offset mark A1 and a second offset mark A2, the first offset mark A1 and the second offset mark A2 are disposed in the first direction, $\vec{L1}$ denotes a vector connecting a center of the first offset mark A1 and a center of the second offset mark A2, and the vector $\vec{L1}$ satisfies: $\vec{L1}=\vec{d1}+\vec{t1}$;

wherein $\vec{t1}$ denotes a first preset deviation, and $|\vec{t1}|\leq 10$ μm;

wherein the non-display region comprises a plurality of first virtual sub-pixels and a plurality of second virtual sub-pixels, and the plurality of first virtual sub-pixels and the plurality of first sub-pixels are the same in shape, size and color, and the plurality of second virtual sub-pixels and the plurality of second sub-pixels are the same in shape, size and color; and the plurality of first virtual sub-pixels and the plurality of second virtual sub-pixels are disposed around the display region;

wherein an array of a pattern composed of the plurality of first virtual sub-pixels and the plurality of first sub-pixels is at least partially consistent with an array of a pattern composed of the plurality of second virtual sub-pixels and the plurality of second sub-pixels, and mutually coincident patterns comprise the pattern composed of the plurality of first sub-pixels and the pattern composed of the plurality of second sub-pixels;

wherein each of the plurality of first sub-pixels comprises a first compensation layer, a first light-emitting layer, and electrode layers disposed on both sides of the first compensation layer and the first light-emitting layer in a light-emitting direction; each of the plurality of second sub-pixels comprise a second compensation layer, a second light-emitting layer, and electrode layers disposed on both sides of the second compensation layer and the second light-emitting layer in the light-emitting direction; and wherein each of the plurality of first virtual sub-pixels comprises at least one of a first compensation layer or a first light-emitting layer and does not comprise an electrode layer; and each of the plurality of second virtual sub-pixels comprises at least one of a second compensation layer or a second light-emitting layer and does not comprise an electrode layer;

wherein the evaporation mask comprises:

a first evaporation region, wherein the first evaporation region comprises a plurality of sub-pixel openings, and the plurality of sub-pixel openings are used for preparing and forming the plurality of first sub-pixels and the plurality of second sub-pixels in the display panel in different evaporation processes, respectively; and a second evaporation region, wherein the second evaporation region is located at a periphery of the first evaporation region, the second evaporation region comprises an offset mark opening, and the offset mark opening is used for respectively preparing and forming the first offset mark A1 and the second offset mark A2 in the display panel in different evaporation processes.

21. A preparation method of a display panel, wherein the display panel is prepared by adopting the evaporation mask, the display panel comprises:

a display region and a non-display region located at a periphery of the display region; wherein, the display region comprises a plurality of first sub-pixels and a plurality of second sub-pixels, and the plurality of first sub-pixels and the plurality of second sub-pixels have a same shape and a same size and are different in color; an array of a pattern composed of the plurality of first sub-pixels is at least partially consistent with an array of a pattern composed of the plurality of second sub-pixels, and at least part patterns of mutually coincident patterns are staggered in a first direction, and $\vec{d1}$ denotes a staggered vector in the first direction; and the non-display region comprises a first offset mark A1 and a second offset mark A2, the first offset mark A1 and the second offset mark A2 are disposed in the first direction, $\vec{L1}$ denotes a vector connecting a center of the first offset mark A1 and a center of the second offset mark A2, and the vector $\vec{L1}$ satisfies: $\vec{L1}=\vec{d1}+\vec{t1}$;

wherein $\vec{t1}$ denotes a first preset deviation, and $|\vec{t1}| \leq 10$ μm;

wherein the non-display region comprises a plurality of first virtual sub-pixels and a plurality of second virtual sub-pixels, and the plurality of first virtual sub-pixels and the plurality of first sub-pixels are the same in shape, size and color, and the plurality of second virtual sub-pixels and the plurality of second sub-pixels are the same in shape, size and color; and the plurality of first virtual sub-pixels and the plurality of second virtual sub-pixels are disposed around the display region;

wherein an array of a pattern composed of the plurality of first virtual sub-pixels and the plurality of first sub-pixels is at least partially consistent with an array of a pattern composed of the plurality of second virtual sub-pixels and the plurality of second sub-pixels, and mutually coincident patterns comprise the pattern composed of the plurality of first sub-pixels and the pattern composed of the plurality of second sub-pixels;

wherein each of the plurality of first sub-pixels comprises a first compensation layer, a first light-emitting layer, and electrode layers disposed on both sides of the first compensation layer and the first light-emitting layer in a light-emitting direction; each of the plurality of second sub-pixels comprise a second compensation layer, a second light-emitting layer, and electrode layers disposed on both sides of the second compensation layer and the second light-emitting layer in the light-emitting direction; and wherein each of the plurality of first virtual sub-pixels comprises at least one of a first compensation layer or a first light-emitting layer and does not comprise an electrode layer; and each of the plurality of second virtual sub-pixels comprises at least one of a second compensation layer or a second light-emitting layer and does not comprise an electrode layer;

wherein the evaporation mask comprises:

a first evaporation region, wherein the first evaporation region comprises a plurality of sub-pixel openings, and the plurality of sub-pixel openings are used for preparing and forming the plurality of first sub-pixels and the plurality of second sub-pixels in the display panel in different evaporation processes, respectively; and a second evaporation region, wherein the second evaporation region is located at a periphery of the first evaporation region, the second evaporation region comprises an offset mark opening, and the offset mark opening is used for respectively preparing and forming the first offset mark A1 and the second offset mark A2 in the display panel in different evaporation processes; and the preparation method of the display panel comprises:

providing a base substrate;

depositing at least one of a first compensation layer or a first light-emitting layer on the base substrate according to the plurality of sub-pixel openings by using the evaporation mask, and meanwhile forming a first offset mark A1; and moving the evaporation mask in the first direction according to a vector $\vec{L1}$, depositing at least one of a second compensation layer or a second light-emitting layer on the base substrate according to the plurality of sub-pixel openings, and meanwhile forming a second offset mark A2, wherein the vector $\vec{L1}$ satisfies: $\vec{L1}=\vec{t1}$, wherein $\vec{t1}$ is a first preset deviation, and $|\vec{t1}| \leq 10$ μm.

22. The preparation method of a display panel of claim 21, wherein the display region in the display panel comprises at least one of a plurality of first sub-pixel minimum repeating units or a plurality of second sub-pixel minimum repeating units, each of the plurality of first sub-pixel minimum repeating unit comprises at least one first sub-pixel of the plurality of first sub-pixels, and each of the plurality of second sub-pixel minimum repeating unit comprises at least one second sub-pixel of the plurality of second sub-pixels;

the plurality of first sub-pixel minimum repeating units are sequentially and periodically disposed in the second direction, and in the second direction, $\vec{C1}$ denotes a vector connecting centers of any two adjacent first sub-pixel minimum repeating units; the plurality of second sub-pixel minimum repeating units are sequentially and periodically disposed in the second direction, and in the second direction, the vector $\vec{C2}$ denotes a vector connecting centers of any two adjacent second sub-pixel minimum repeating units, and $\vec{C1}$ and $\vec{C2}$ have a same direction and a same distance;

wherein in the preparation method of the display panel, depositing the at least one of the first compensation layer or the first light-emitting layer on the base substrate according to the plurality of sub-pixel openings by using the evaporation mask, and meanwhile forming the first offset mark A1 comprises:

depositing the first compensation layer on the base substrate according to the plurality of sub-pixel openings by using the evaporation mask, and meanwhile forming the first offset mark A1; and moving the evaporation mask in the second direction according to a vector $\vec{P1}$, and depositing the first light-emitting layer on the base substrate according to the plurality of sub-openings, and meanwhile forming a first offset mark B1, wherein the vector $\vec{P1}$ satisfies: $\vec{P1}=n1 \times \vec{C1}+\vec{t2}$, wherein n1 is an integer greater than or equal to 1, $\vec{t2}$ is a second preset deviation, and $|\vec{t2}| \leq 10$ μm;

wherein depositing the at least one of the second compensation layer or the second light-emitting layer on the base substrate according to the plurality of sub-pixel openings, and meanwhile forming the second offset mark A2 comprises:

depositing the second compensation layer on the base substrate according to the plurality of sub-pixel openings by using the evaporation mask, and meanwhile forming the second offset mark A2; and moving the evaporation mask in the second direction according to a vector $\vec{P2}$, and depositing the second light-emitting layer on the base substrate according to the plurality of sub-pixel openings, and meanwhile forming the second offset mark B2, wherein the vector $\vec{P2}$ satisfies: $\vec{P2}=n2\times\vec{C1}+\vec{t3}$, n2 is an integer greater than or equal to 1, $\vec{t3}$ is a third preset deviation, and $|\vec{t3}|\leq 10$ μm.

23. The preparation method of a display panel of claim 21, wherein the display region in the display panel further comprises a plurality of third sub-pixels, and the plurality of third sub-pixels and the plurality of first sub-pixels are the same in shape and size, and the plurality of third sub-pixels have a different color than the plurality of first sub-pixels and the plurality of second sub-pixels; an array of a pattern composed of the plurality of third sub-pixels is at least partially consistent with the array of the pattern composed of the plurality of first sub-pixels, and at least part patterns of mutually coincident patterns are staggered in a fourth direction, and a stagged vector is $\vec{d2}$;

the preparation method of a display panel further comprises:

moving the evaporation mask in the fourth direction according to a vector $\vec{L2}$, and depositing at least one of a third compensation layer or a third light-emitting layer on the base substrate according to the plurality of sub-pixel openings, and meanwhile forming a third offset mark A3, wherein the vector $\vec{L2}$ satisfies $\vec{L2}=\vec{d2}+\vec{t4}$; wherein $\vec{t4}$ is a fourth preset deviation, and $|\vec{t4}|\leq 10$ μm.

* * * * *